United States Patent
Jeong et al.

(10) Patent No.: US 10,720,501 B2
(45) Date of Patent: Jul. 21, 2020

(54) DISPLAY SUBSTRATE CAPABLE OF DECREASING DEFECTS AND THE METHOD OF THE SAME

(71) Applicant: Samsung Display Co., Ltd., Yongin-Si, Gyeonggi-Do (KR)

(72) Inventors: Yu-Gwang Jeong, Anyang-si (KR); Shin-Il Choi, Hwaseong-si (KR); Su-Bin Bae, Gyeongsan-si (KR); Sung-Hoon Yang, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/563,948

(22) Filed: Sep. 9, 2019

(65) Prior Publication Data

US 2020/0006503 A1 Jan. 2, 2020

Related U.S. Application Data

(62) Division of application No. 14/606,986, filed on Jan. 27, 2015, now Pat. No. 10,438,974.

(30) Foreign Application Priority Data

Aug. 8, 2014 (KR) ........................ 10-2014-0102372

(51) Int. Cl.
*H01L 29/417* (2006.01)
*H01L 27/12* (2006.01)
*H01L 29/45* (2006.01)
*H01L 29/66* (2006.01)
*H01L 23/532* (2006.01)

(52) U.S. Cl.
CPC ...... *H01L 29/41733* (2013.01); *H01L 27/124* (2013.01); *H01L 27/127* (2013.01); *H01L 27/1288* (2013.01); *H01L 29/458* (2013.01); *H01L 29/66765* (2013.01); *H01L 23/53214* (2013.01); *H01L 23/53257* (2013.01); *H01L 2924/0002* (2013.01)

(58) Field of Classification Search
CPC .............. H01L 27/124; H01L 27/1244; H01L 29/41733; H01L 29/458; H01L 29/66765
See application file for complete search history.

(56) References Cited

U.S. PATENT DOCUMENTS

| | | | |
|---|---|---|---|
| 6,518,630 | B2 | 2/2003 | You et al. |
| 2006/0186804 | A1 | 8/2006 | Sakakura et al. |
| 2007/0103614 | A1 | 5/2007 | Yoon et al. |
| 2015/0194498 | A1 | 7/2015 | Yuan |
| 2015/0295092 | A1 | 10/2015 | Misaki |

FOREIGN PATENT DOCUMENTS

| | | |
|---|---|---|
| KR | 10-2002-0088461 A | 11/2002 |
| KR | 10-2003-0058325 A | 7/2003 |
| KR | 0-2008-0029387 A | 4/2008 |
| KR | 10-2012-0135924 A | 12/2012 |

*Primary Examiner* — Jesse Y Miyoshi
(74) *Attorney, Agent, or Firm* — Innovation Counsel LLP

(57) ABSTRACT

According to an exemplary embodiment, a display substrate includes a gate metal pattern comprising a gate electrode, an active pattern disposed on the gate pattern and a source metal pattern disposed on the active pattern. The source metal pattern includes a first lower pattern disposed on the active pattern, a second lower pattern disposed on the first lower pattern, a low-resistance metal pattern disposed on the second lower pattern, and an upper pattern disposed on the low-resistance metal pattern. The first lower pattern, the second lower pattern, and the upper pattern each include a material that is the same.

10 Claims, 20 Drawing Sheets

DISPLAY SUBSTRATE CAPABLE OF DECREASING DEFECTS AND THE METHOD OF THE SAME

CROSS-REFERENCE TO RELATED APPLICATIONS

This application is a divisional application of U.S. patent application Ser. No. 14/606,986 filed on Jan. 27, 2015, which claims priority under 35 U.S.C. § 119 to Korean Patent Application No. 10-2014-0102372, filed on Aug. 8, 2014 in the Korean Intellectual Property Office KIPO, the contents of which are herein incorporated by reference in their entireties.

BACKGROUND

1. Field

Exemplary embodiments of the present system and method relate to a display substrate and method of manufacturing the display substrate. More particularly, the present system and method relate to a display substrate capable of reducing occurrences of a faulty channel and method of manufacturing the display substrate.

2. Description of the Related Art

In general, a liquid crystal display apparatus includes a display substrate, an opposite substrate and a liquid crystal layer interposed between the display substrate and the opposite substrate. The display substrate includes a plurality of gate lines, a plurality of data lines crossing the gate lines, a plurality of switching elements electrically connected to the gate lines and the data lines, and a plurality of pixel electrodes electrically connected to the switching elements.

As a display apparatus increases in size and resolution, a resistance-capacitance (RC) delay of a metal line formed on the display substrate may also increase. To reduce the RC delay, the metal line may include an aluminum material having a relatively low resistance. However, including the aluminum material in the metal line may cause a defect ratio to increase. For example, a defect in which the contact resistance between the metal layer including aluminum and a metal layer including a different metal is relatively high may occur. Another defect may occur by aluminum ions diffusing into a silicon layer. Further, an etchant used in the dry-etching process may cause damage to the metal line including aluminum. Accordingly, faults such as staining of the display panel may occur.

SUMMARY

Exemplary embodiments of the present system and method provide a display substrate capable of decreasing a faulty of channel.

Exemplary embodiments of the present system and method further provide method of manufacturing the display substrate.

In an exemplary embodiment of a display substrate according to the present system and method, the display substrate includes a gate metal pattern comprising a gate electrode, an active pattern disposed on the gate metal pattern and a source metal pattern disposed on the active pattern. The source metal pattern includes a first lower pattern disposed on the active pattern, a second lower pattern disposed on the first lower pattern, a low-resistance metal pattern disposed on the second lower pattern, and an upper pattern disposed on the low-resistance metal pattern. The first lower pattern, the second lower pattern, and the upper pattern each include a material that is the same.

In an exemplary embodiment, the source metal pattern may further include a third lower pattern disposed between the first lower pattern and the second lower pattern.

In an exemplary embodiment, the third lower pattern may include nitrogen (N2).

In an exemplary embodiment, the source metal pattern may further include a third lower pattern disposed between the second lower pattern and the low-resistance metal pattern.

In an exemplary embodiment, the third lower pattern may include nitrogen (N2).

In an exemplary embodiment, the first lower pattern, the second lower pattern and the upper pattern may include at least one material selected from the group consisting of molybdenum (Mo) and molybdenum alloy.

In an exemplary embodiment, the low-resistance metal pattern may include at least one material selected from the group consisting of aluminum (Al) and aluminum alloy.

In an exemplary embodiment of method of manufacturing a display substrate according to the present system and method, the method includes forming a gate metal pattern comprising a gate electrode on a substrate, forming a gate insulation layer that covers the gate metal pattern, forming an active layer on the gate insulation layer, forming a source metal layer on the active layer, forming a photoresist layer on the source metal layer, developing the photoresist layer to form a first photoresist pattern and forming an active pattern and a source metal pattern by etching the active layer and the source metal layer while using the first photoresist pattern as a mask. Forming the source metal layer includes depositing a first lower layer on the active layer, depositing a second lower layer on the first lower layer, depositing a low-resistance metal layer on the second lower layer and depositing an upper layer on the low-resistance metal layer.

In an exemplary embodiment, forming the source metal layer may include performing a plasma process on the first lower layer after the first lower layer is deposited.

In an exemplary embodiment, performing a plasma process on the first lower layer may be performed by using a gas comprising nitrogen (N2).

In an exemplary embodiment, forming the source metal layer may further include depositing a third lower layer on the first lower layer after the first lower layer is deposited.

In an exemplary embodiment, the third lower pattern may include molybdenum nitride (MoN).

In an exemplary embodiment, the source metal layer may further include performing a plasma process on the second lower layer after the second lower layer is deposited.

In an exemplary embodiment, performing a plasma process on the first lower layer may be performed by using a gas comprising nitrogen (N2).

In an exemplary embodiment, forming the source metal layer may include depositing a third lower layer on the second lower layer after the second lower layer is deposited.

In an exemplary embodiment, the third lower pattern may include molybdenum nitride (MoN).

In an exemplary embodiment, forming the active pattern and the source metal pattern may include wet-etching, using the first photoresist pattern as a first mask, the source metal layer, removing a portion of the first photoresist pattern to form a second photoresist pattern exposing a portion of the source metal layer and dry-etching, using the second photoresist pattern as a second mask, the active and the source metal layer to form the active pattern and the source metal pattern.

In an exemplary embodiment, the first lower layer, the second lower layer and the upper layer may include at least one material selected from the group consisting of molybdenum (Mo) and molybdenum alloy.

In an exemplary embodiment, the low-resistance metal layer may include at least one material selected from the group consisting of aluminum (Al) and aluminum alloy.

According to the present exemplary embodiment, a lower pattern of a source metal pattern has a multilayer structure. The lower pattern includes a first lower pattern and a second lower pattern. Thus, the lower pattern may be a dense structure. Therefore, residual aluminum in a channel may be minimized, so that faulty of a display apparatus may be prevented.

In addition, a lower pattern includes a first lower pattern, a second lower pattern ad a third lower pattern. The third lower pattern is formed by performing a plasma process on the first lower pattern and the second lower pattern. The plasma process is performed by using gas comprising nitrogen (N2). The third lower pattern may be a dense structure and enhance the dense structure of the lower pattern. Therefore, residual aluminum in a channel may be minimized, so that faulty of a display apparatus may be prevented.

BRIEF DESCRIPTION OF THE DRAWINGS

The above and other features and advantages of the present system and method are described below with reference to exemplary embodiments and the accompanying drawings, in which.

DETAILED DESCRIPTION

Hereinafter, the present system and method are explained with reference to the accompanying drawings.

Figure 1:
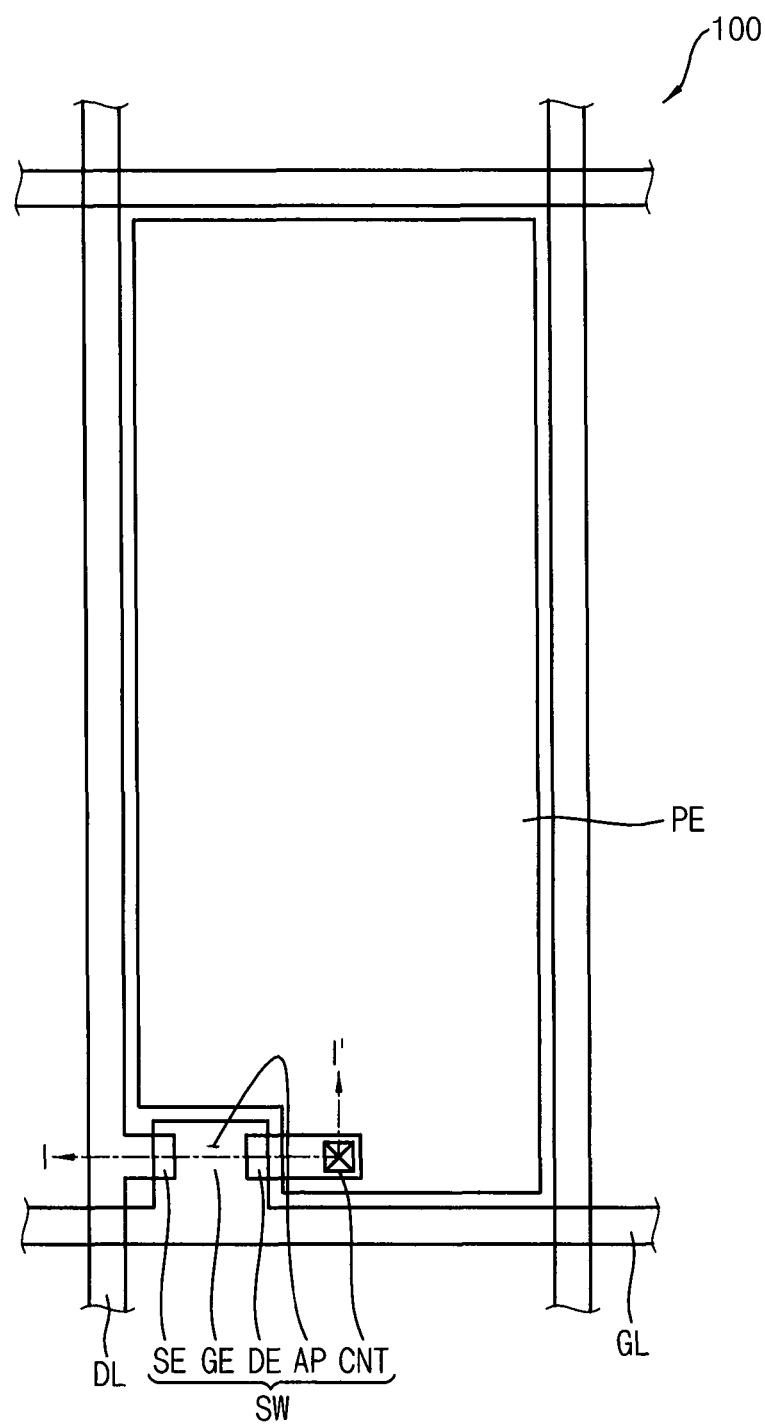
FIG. 1 is a plan view illustrating a display substrate, according to an exemplary embodiment of the present system and method.
Figure 2:
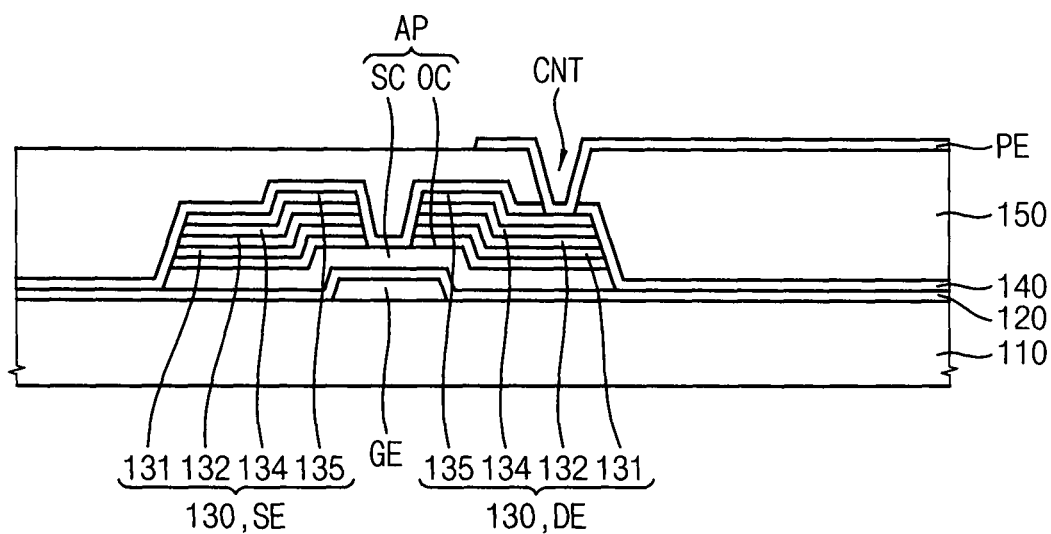
FIG. 2 is a cross-sectional view taken along a line I-I' of FIG. 1, according to an exemplary embodiment of the present system and method.

FIG. 1 is a plan view illustrating a display substrate according to an exemplary embodiment of the present system and method. FIG. 2 is a cross-sectional view taken along a line I-I' of FIG. 1, according to an exemplary embodiment of the present system and method.

Referring to FIG. 1, a display substrate includes a gate line GL, a data line DL crossing the gate line GL, a switching element SW and a pixel electrode PE. The switching element SW may be electrically connected with the gate line GL and the data line DL. The pixel electrode PE may be electrically connected with the switching element SW through a contact hole CNT.

The gate line GL extends in a first direction D1 and is electrically connected to a gate electrode GE of the switching element SW. Portions of the gate line GL may form the gate electrode GE. In an exemplary embodiment, the gate line GL may have a single layer structure and include one or more of copper (Cu), silver (Ag), chrome (Cr), molybdenum (Mo), aluminum (Al), titanium (Ti), and manganese (Mn). In another exemplary embodiment, the gate line GL may have a multilayer structure with a plurality of layers formed from an assortment of different materials. For example, the gate line GL may include a copper layer and a titanium layer disposed on and/or under the copper layer.

Referring to FIG. 2, a gate insulation layer 120 is formed on the gate line GL and the gate electrode GE. The gate insulation layer 120 may include an inorganic material such as silicon oxide (SiOx) and/or silicon nitride (SiNx). The gate insulation layer 120 may have a thickness of about 500 Å. The gate insulation layer 120 may include a plurality of layers formed from an assortment of different materials.

An active pattern AP is formed on the gate insulation layer 120 of FIG. 2. The active pattern AP may include a semiconductor pattern SC and an ohmic contact pattern OC. The ohmic contact pattern OC is formed on the semiconductor pattern SC. The semiconductor pattern SC may include a silicon semiconductor material. For example, the semiconductor pattern SC may include amorphous silicon (a-Si:H). The ohmic contact pattern OC may be interposed between the semiconductor pattern SC and a source electrode SE, and may be interposed between the semiconductor pattern SC and a drain electrode DE. The ohmic contact pattern OC may include n+ amorphous silicon (n+ a-Si:H).

A source metal pattern 130 is formed on the active pattern AP of FIG. 2. The source metal pattern 130 may include the data line DL, a source electrode SE and a drain electrode DE. The source metal pattern 130 has a multilayer structure. The source metal pattern 130 includes a first lower pattern 131 disposed on the active pattern AP, a second lower pattern 132 including the same material as the first lower pattern 131 and disposed on the first lower pattern 131, a low-resistance metal pattern 134 disposed on the second lower pattern 132, and an upper pattern 135 including the same material as the first lower pattern 131 and the second low pattern 132 and disposed on the low-resistance metal pattern 134.

The first lower pattern 131, the second lower pattern 132 and the upper pattern 135 may include molybdenum (Mo) and/or a molybdenum alloy. The low-resistance metal pattern 134 may include aluminum (Al) and/or an aluminum alloy.

A passivation layer 140 is formed on the source metal pattern 130 of FIG. 2. The passivation layer 140 may include an inorganic material such as silicon oxide (SiOx) and/or silicon nitride (SiNx). The passivation layer 140 may have a thickness of about 500 Å. The passivation layer 140 may include a plurality of layers formed from an assortment of different materials.

An organic layer 150 is disposed on the passivation layer 140 of FIG. 2. The organic layer 150 planarizes an upper surface of the display substrate 100 so that the uneven steps caused by the various underlying structures do not lead to problems such as disconnection of a signal line. The organic layer 150 may be an insulation layer that includes an organic material. The organic layer 150 may include a color filter layer. For example, the color filter layer may have a red color, a green color, a blue color or a white color.

A pixel electrode PE is formed on the organic layer 150 of FIG. 2. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE, such as through the contact hole CNT.

FIGS. 3 to 11 are cross-sectional views illustrating a method of manufacturing the display substrate of FIG. 2, according to an exemplary embodiment of the present system and method.

Figure 3:
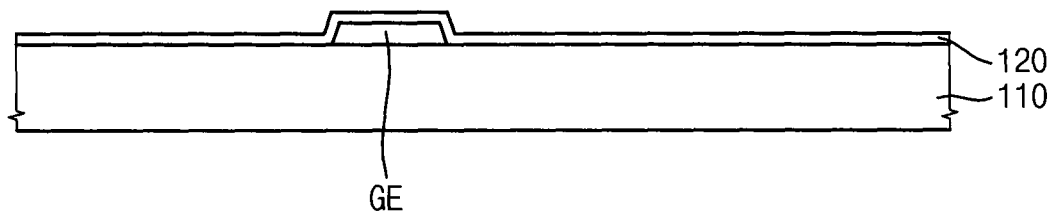
FIGS. 3 to 11 are cross-sectional views illustrating a method of manufacturing the display substrate of FIG. 2, according to an exemplary embodiment of the present system and method.

Referring to FIG. 3, a gate metal pattern including a gate electrode GE is formed on the base substrate 110. The gate metal pattern may include a gate line electrically connected with the gate electrode GE. The gate metal pattern may be formed by forming a gate metal layer on the base substrate 110 and then patterning the gate metal layer to form the gate line and the gate electrode GE. Examples of the base substrate 110 may include a glass substrate, a quartz substrate, a silicon substrate, a plastic substrate or the like.

The gate metal layer may have a single layer structure and include one or more of copper (Cu), silver (Ag), chrome (Cr), molybdenum (Mo), aluminum (Al), titanium (Ti), and manganese (Mn). In addition, the gate metal layer may have a multilayer structure with a plurality of layers formed from an assortment of different materials. For example, the gate metal layer may include a copper layer and a titanium layer disposed on and/or under the copper layer.

FIG. 3 further shows that a gate insulation layer 120 is formed on the gate line GL and the gate electrode GE. The gate insulation layer 120 may include an inorganic material such as silicon oxide (SiOx) and/or silicon nitride (SiNx). The gate insulation layer 120 may include a plurality of layers formed from an assortment of different materials.

Figure 4:
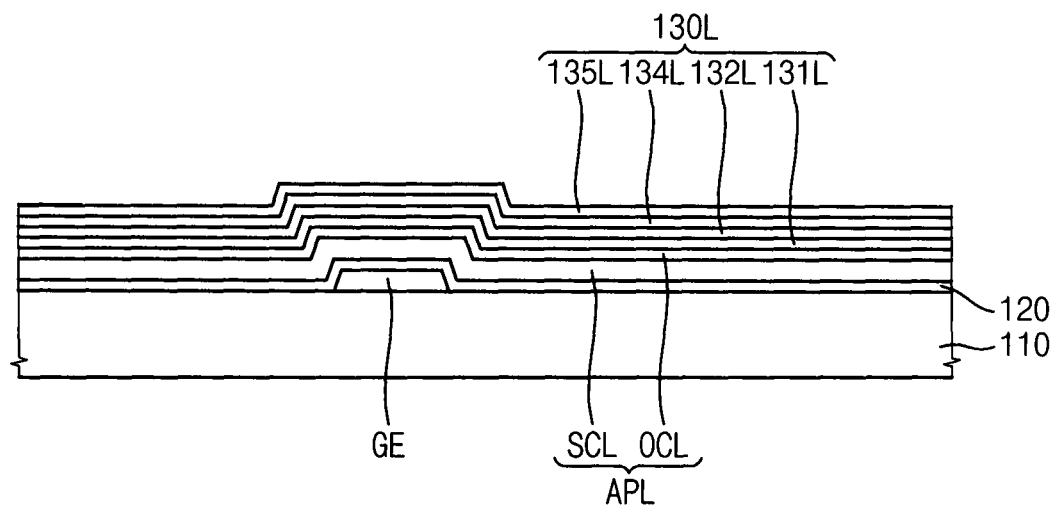

Referring to FIG. 4, a semiconductor layer SCL, an ohmic contact layer OCL and a source metal layer 130L are formed on the gate insulation layer 120, one on top of another in the order shown. The semiconductor layer SCL may include amorphous silicon (a-Si:H). The ohmic contact layer OCL may include n+ amorphous silicon (n+ a-Si:H). The source metal layer 130L has a multilayer structure. The source metal layer 130L includes a first lower layer 131L disposed on the ohmic contact layer OCL, a second lower layer 132L including the same material as the first lower layer 131L and disposed on the first lower layer 131L, a low-resistance metal layer 134L disposed on the second lower layer 132L, and an upper layer 135L including the same material as the first lower layer 131L and the second low layer 132L and disposed on the low-resistance metal layer 134L.

The first lower layer 131L, the second lower layer 132L and the upper layer 135L may include molybdenum (Mo) and/or a molybdenum alloy. The low-resistance metal layer 134L may include aluminum (Al) and/or an aluminum alloy.

Figure 5:
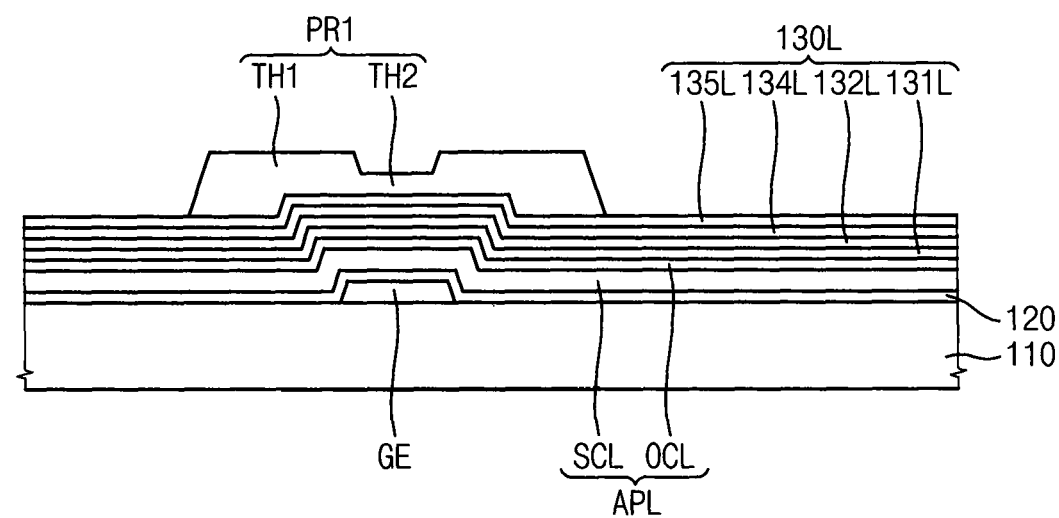

Referring to FIG. 5, a photoresist composition is coated on the source metal layer 130L to form a photoresist layer. The photoresist layer is patterned to form a first photoresist pattern PR1.

The photoresist composition may include a novolak resin, a diazide-based photo-sensitizer, and a solvent. For example, about 5% to about 30% by weight of the photoresist composition may be the novolak resin, about 2% to about 10% by weight may be the diazide-based photo-sensitizer, and the remainder may be the solvent. The novolak resin may be alkali-soluble, and may be prepared from a condensation reaction of a monomer mixture including a cresol mixture, xylenol and salicylaldehyde. The cresol mixture may include m-cresol and p-cresol.

For example, about 20% to about 50% by weight of the monomer mixture may include a cresol mixture of m-cresol and p-cresol, about 20% to about 30% by weight may be xylenol, and about 30% to about 50% by weight may be salicylaldehyde. In the cresol mixture, a weight ratio of m-cresol to p-cresol may be about 3:7 to 7:3. The monomer mixture may further include formaldehyde.

The photoresist composition may be positive-typed. The photoresist layer may be pre-baked, exposed to light, developed and hard-baked to form the first photoresist pattern PR1. The temperature for pre-baking may be about 80° C. to about 120° C. The temperature for hard-baking may be about 120° C. to about 150° C.

The first photoresist pattern PR1 of FIG. 5 overlaps with the gate electrode GE and has a thickness gradient. For example, the first photoresist pattern PR1 includes a first thickness portion TH1 and a second thickness portion TH2 thinner than the first thickness portion TH1. The second thickness portion TH2 overlaps with the gate electrode GE.

The first photoresist pattern PR1 has an improved heat resistance. Thus, a profile of the first photoresist pattern PR1 may be maintained in a hard-baking process. Thus, a reliability of a photolithography process may be improved.

Figure 6:
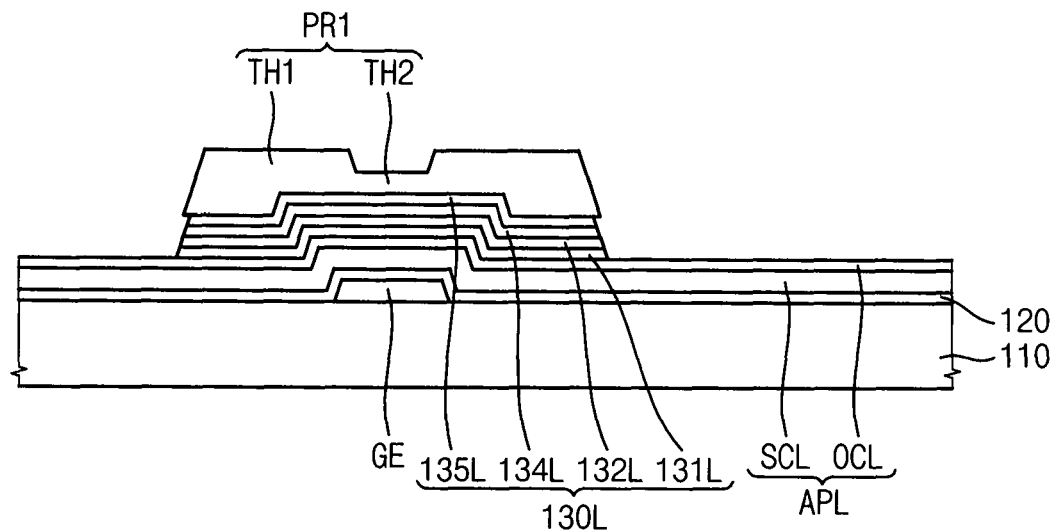

Referring to FIG. 6, the source metal layer 130L is patterned by using the first photoresist pattern PR1 as a mask to form a source metal pattern 130 and expose an upper surface of the ohmic contact layer OCL. In an exemplary embodiment, the source metal layer 130L may be etched through a wet-etching process using an etchant. The source metal pattern 130 may include a data line crossing the gate line.

Figure 7:
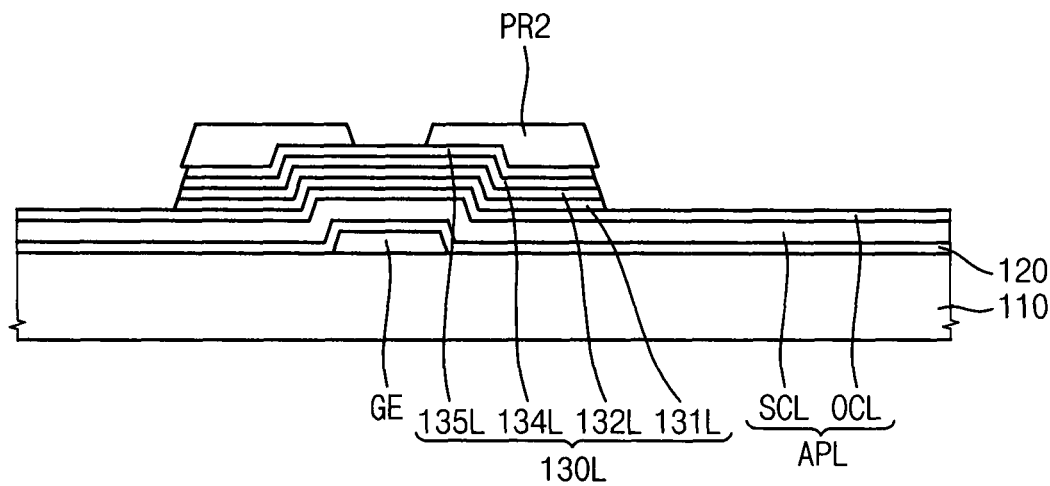

Referring to FIG. 7, the first photoresist pattern PR1 is partially removed, for example, through an ashing process. The second thickness portion TH2 is removed, and part of the first thickness portion TH1 remains to form the second photoresist pattern PR2. The second photoresist pattern PR2 exposes a portion of the source metal pattern 130 that overlaps with the gate electrode GE.

Figure 8:
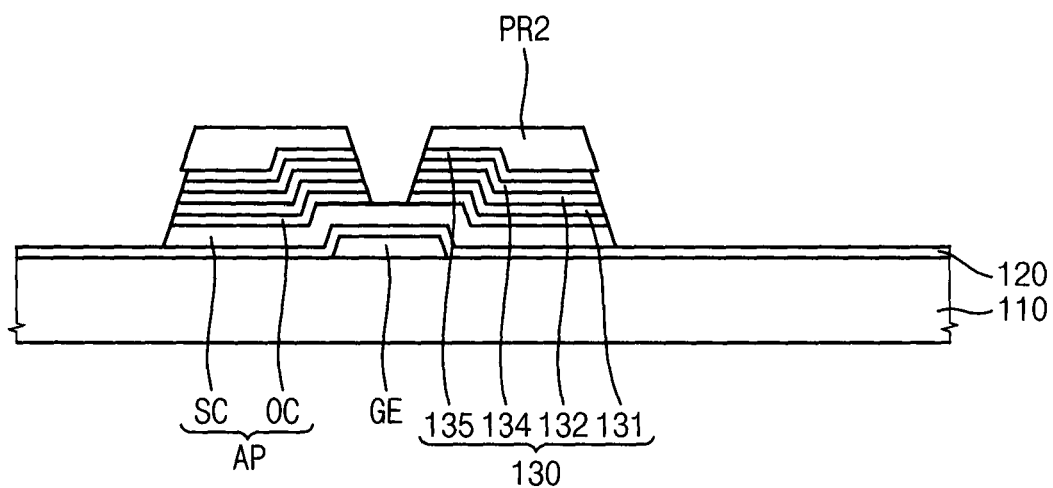

Referring to FIG. 8, the exposed portion of the source metal pattern 130 and a portion of the ohmic contact layer OCL are removed, for example, through a dry-etching process to form a source electrode SE and a drain electrode DE. Furthermore, portions of the ohmic contact layer OCL and the semiconductor layer SCL that are not covered by the photoresist pattern are removed to form a semiconductor pattern SC and an ohmic contact pattern OC disposed on the semiconductor pattern SC.

Figure 9:
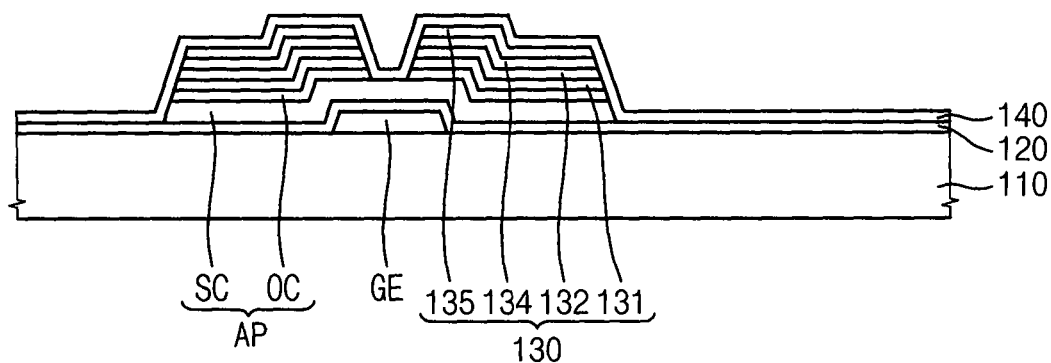

Referring to FIG. 9, a passivation layer 140 is formed and covers the source electrode SE and the drain electrode DE. The passivation layer 140 may include an inorganic material such as silicon oxide (SiOx) and/or silicon nitride (SiNx). The passivation layer 140 may have a thickness of about 500

Å. In addition, the passivation layer 140 may include a plurality of layers formed from an assortment of different materials.

Figure 10:
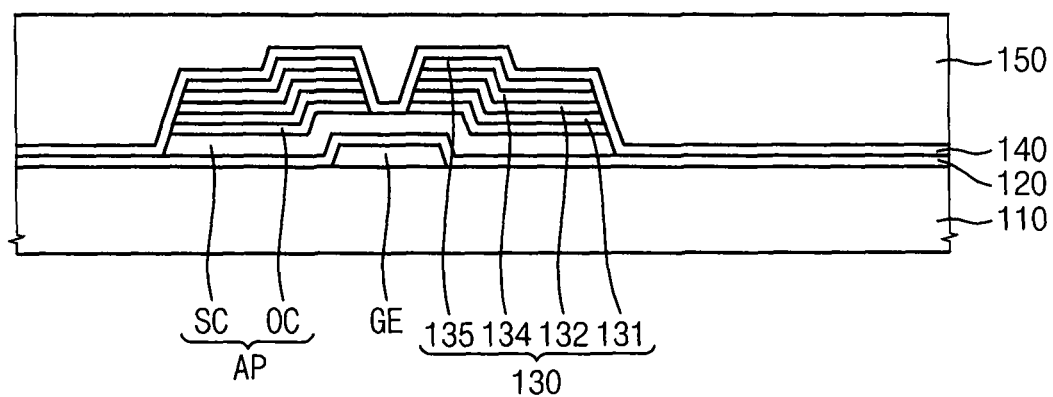

Referring to FIG. 10, an organic layer 150 is formed on the base substrate 110 on which the passivation layer 140 is formed. The organic layer 150 planarizes an upper surface of the display substrate 100 so that the uneven steps caused by the various structures do not lead to problems such as disconnection of a signal line. The organic layer 150 may be an insulation layer and include an organic material. The organic layer 150 may include a color filter layer. For example, the color filter layer may have a red color, a green color, a blue color or a white color.

Figure 11:
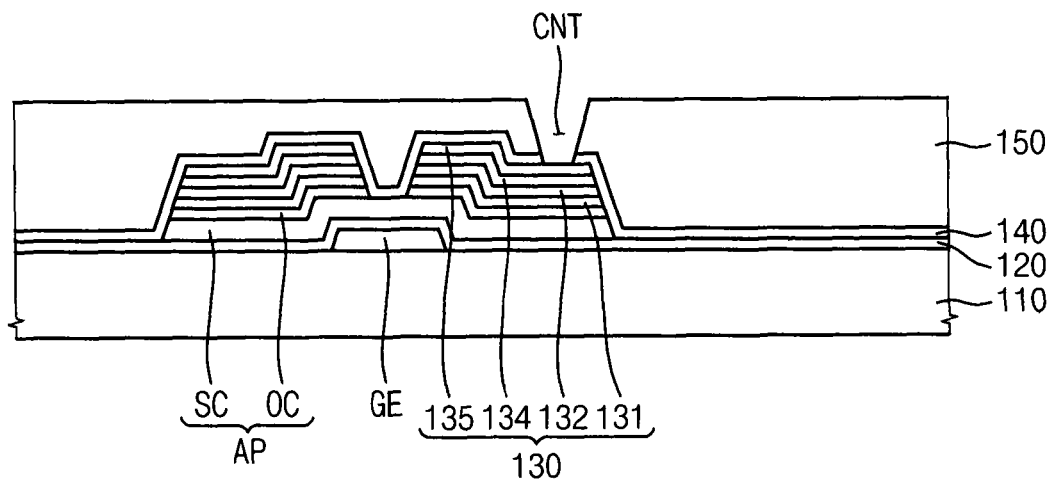

Referring to FIG. 11, a contact hole CNT is formed through the passivation layer 140 and the organic layer 150 to expose the drain electrode DE. As FIG. 2 shows, the pixel electrode PE is electrically connected with the drain electrode DE through the contact hole CNT. The pixel electrode PE may be formed, for example, by forming a transparent conductive layer on the organic layer 150 and then patterning the transparent conductive layer into the pixel electrode PE. The transparent conductive layer may include a transparent conductive material, such as indium tin oxide (ITO) and indium zinc oxide (IZO).

According to an exemplary embodiment of the present system and method, the source metal pattern 130 has a multilayer structure. The source metal pattern 130 includes a first lower pattern 131, a second lower pattern 132, a low-resistance metal pattern 134, and an upper pattern 135. The lower pattern including molybdenum (Mo) may be deposited as a columnar shape. The first lower pattern 131, second lower pattern 132, and upper pattern 135 include molybdenum (Mo) and/or a molybdenum alloy. The low-resistance metal pattern 134 includes aluminum (Al) and/or an aluminum alloy.

In a case in which a gas such as sulphur hexafluoride (SF6) is used in the etching process for forming the source metal pattern 130 of the above-described embodiment, the lower pattern and the upper pattern including molybdenum (Mo) may form a molybdenum fluoride (MoFx), and the low-resistance metal pattern including aluminum (Al) may form an aluminum fluoride (ALFx). Molybdenum fluoride (MoFx) is a volatile material. However, aluminum fluoride (ALFx) is a non-volatile material. Therefore, the aluminum fluoride (ALFx) that is formed remains in a channel after the etching process is performed.

Furthermore, because the lower pattern including molybdenum (Mo) is formed as a multilayer structure (i.e., include the first lower pattern 131 and the second lower pattern 132), the lower pattern in the above-described embodiment is a dense structure. The denseness of the lower pattern reduces the amount of residual aluminum in the channel, and thereby prevents or otherwise reduces occurrences of a faulty display apparatus.

Figure 12:
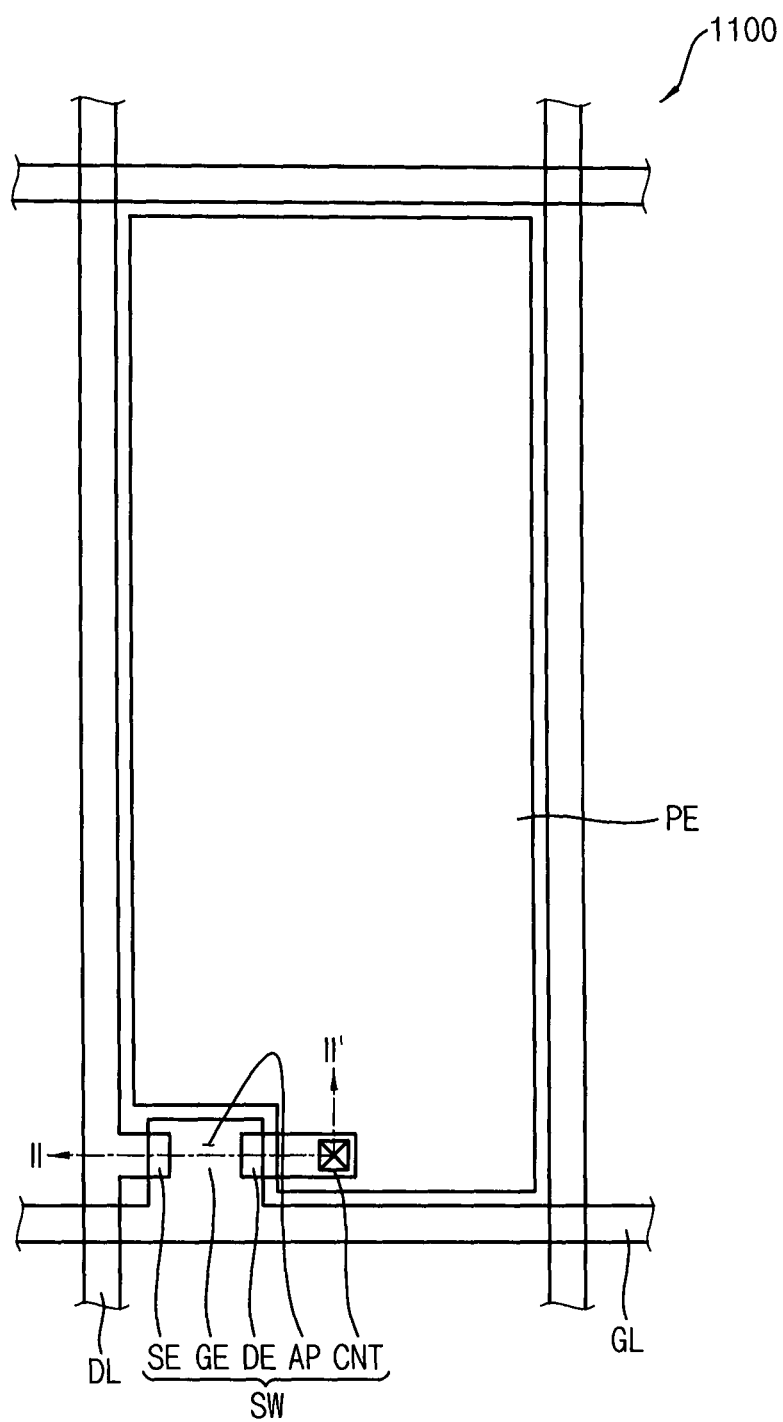
FIG. 12 is a plan view illustrating a display substrate, according to an exemplary embodiment of the present system and method.
Figure 13:
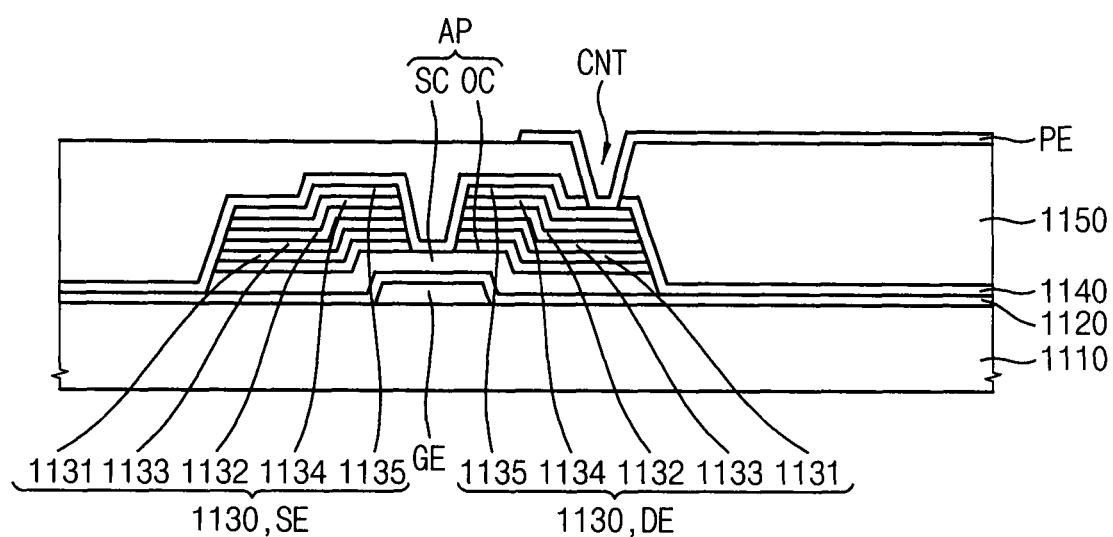
FIG. 13 is a cross-sectional view taken along a line II-II' of FIG. 12, according to an exemplary embodiment of the present system and method.

FIG. 12 is a plan view illustrating a display substrate, according to an exemplary embodiment of the present system and method. FIG. 13 is a cross-sectional view taken along a line II-II' of FIG. 12, according to an exemplary embodiment of the present system and method.

Referring to FIG. 12, a display substrate includes a gate line GL, a data line DL crossing the gate line GL, a switching element SW and a pixel electrode PE. The switching element SW may be electrically connected with the gate line GL and the data line DL. The pixel electrode PE may be electrically connected with the switching element SW through a contact hole CNT.

The gate line GL extends in a first direction D1 and is electrically connected to a gate electrode GE of the switching element SW. Portions of the gate line GL may form the gate electrode GE. In an exemplary embodiment, the gate line GL may have a single layer structure and include one or more of copper (Cu), silver (Ag), chrome (Cr), molybdenum (Mo), aluminum (Al), titanium (Ti), and manganese (Mn). In another exemplary embodiment, the gate line GL may have a multilayer structure with a plurality of layers formed from an assortment of different materials. For example, the gate line GL may include a copper layer and a titanium layer disposed on and/or under the copper layer.

Referring to FIG. 13, a gate insulation layer 1120 is formed on the gate line GL and the gate electrode GE. The gate insulation layer 1120 may include an inorganic material such as silicon oxide (SiOx) and/or silicon nitride (SiNx). The gate insulation layer 1120 may have a thickness of about 500 Å. The gate insulation layer 1120 may include a plurality of layers formed from an assortment of different materials.

An active pattern AP is formed on the gate insulation layer 1120 of FIG. 13. The active pattern AP may include a semiconductor pattern SC and an ohmic contact pattern OC. The ohmic contact pattern OC is formed on the semiconductor pattern SC. The semiconductor pattern SC may include a silicon semiconductor material. For example, the semiconductor pattern SC may include amorphous silicon (a-Si:H). The ohmic contact pattern OC may be interposed between the semiconductor pattern SC and a source electrode SE, and may be interposed between the semiconductor pattern SC and a drain electrode DE. The ohmic contact pattern OC may include n+ amorphous silicon (n+ a-Si:H).

A source metal pattern 1130 is formed on the active pattern AP of FIG. 13. The source metal pattern 1130 may include the data line DL, a source electrode SE and a drain electrode DE. The source metal pattern 1130 has a multilayer structure. The source metal pattern 1130 includes a first lower pattern 1131 disposed on the active pattern AP, a third lower pattern 1133 disposed on the first lower pattern 1131, a second lower pattern 1132 including the same material as the first lower pattern 1131 and disposed on the third lower pattern 1133, a low-resistance metal pattern 1134 disposed on the second lower pattern 1132 and an upper pattern 1135 including the same material as the first lower pattern 1131 and the second low pattern 1132 and disposed on the low-resistance metal pattern 1134.

The first lower pattern 1131, the second lower pattern 1132 and the upper pattern 1135 may include molybdenum (Mo) and/or a molybdenum alloy. The low-resistance metal pattern 1134 may include aluminum (Al) and/or an aluminum alloy. The third lower pattern 1133 may include nitrogen (N2). For example, the third lower pattern 1133 may be formed by performing a plasma process on the first lower pattern 1131 using a gas that includes nitrogen (N2). However, the present system and method are not limited thereto. In another embodiment, the third lower pattern 1133 may be formed by depositing a layer including molybdenum nitride (MoN).

A passivation layer 1140 is formed on the source metal pattern 1130 of FIG. 13.

The passivation layer 1140 may include an inorganic material such as silicon oxide (SiOx) and/or silicon nitride (SiNx). The passivation layer 1140 may have a thickness of about 500 Å. The passivation layer 1140 may include a plurality of layers formed from an assortment of different materials.

An organic layer 1150 is disposed on the passivation layer 1140 of FIG. 13. The organic layer 1150 planarizes an upper surface of the display substrate 1100 so that the uneven steps caused by the various underlying structures do not lead to problems such as disconnection of a signal line. The organic layer 1150 may be an insulation layer that includes an organic material. The organic layer 1150 may include a color filter layer. For example, the color filter layer may have a red color, a green color, a blue color or a white color.

A pixel electrode PE is formed on the organic layer 1150 of FIG. 13. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE, such as through the contact hole CNT.

FIGS. 14 to 23 are cross-sectional views illustrating a method of manufacturing the display substrate of FIG. 13, according to an exemplary embodiment of the present system and method.

Figure 14:
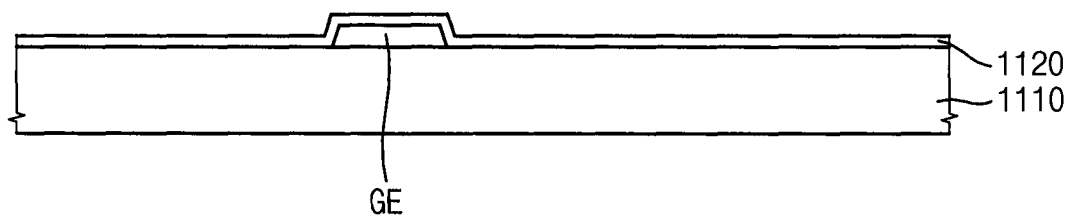
FIGS. 14 to 23 are cross-sectional views illustrating a method of manufacturing the display substrate of FIG. 13, according to an exemplary embodiment of the present system and method.

Referring to FIG. 14, a gate metal pattern including a gate electrode GE is formed on the base substrate 1110. The gate metal pattern may include a gate line electrically connected with the gate electrode GE. The gate metal pattern may be formed by forming a gate metal layer on the base substrate 1110 and then patterning the gate metal layer to form the gate line and the gate electrode GE. Examples of the base substrate 1110 may include a glass substrate, a quartz substrate, a silicon substrate, a plastic substrate or the like.

The gate metal layer may have a single layer structure and include one or more of copper (Cu), silver (Ag), chrome (Cr), molybdenum (Mo), aluminum (Al), titanium (Ti), and manganese (Mn). In addition, the gate metal layer may have a multilayer structure with a plurality of layers formed from an assortment of different materials. For example, the gate metal layer may include a copper layer and a titanium layer disposed on and/or under the copper layer.

FIG. 14 further shows that a gate insulation layer 1120 is formed on the gate line GL and the gate electrode GE. The gate insulation layer 1120 may include an inorganic material such as silicon oxide (SiOx) and/or silicon nitride (SiNx). The gate insulation layer 1120 may include a plurality of layers formed from an assortment of different materials.

Figure 15:
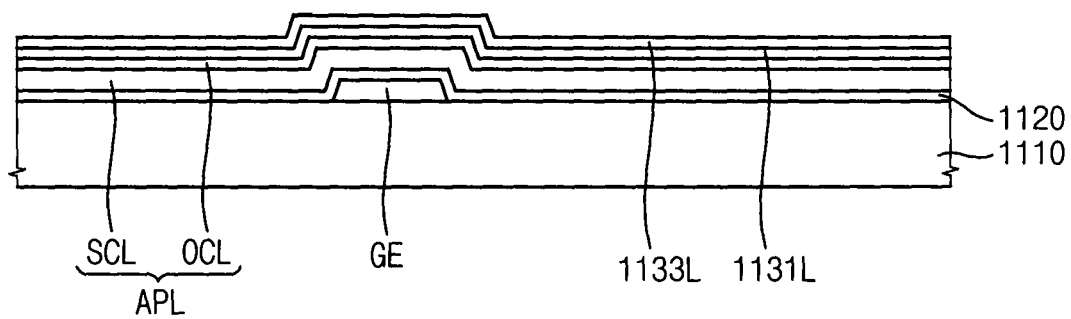

Referring to FIG. 15, a semiconductor layer SCL, an ohmic contact layer OCL and a source metal layer 1130L are formed on the gate insulation layer 1120, one on top of another in the order shown. The semiconductor layer SCL may include amorphous silicon (a-Si:H). The ohmic contact layer OCL may include n+ amorphous silicon (n+ a-Si:H). The source metal layer 1130L has a multilayer structure. The source metal layer 1130L includes a first lower layer 1131L and a third lower layer 1133L disposed on the ohmic contact layer OCL.

The first lower layer 1131L may include molybdenum (Mo) and/or a molybdenum alloy. The third lower layer 1133L may include nitrogen (N2). The third lower layer 1133L may be formed by performing a plasma process on the first lower layer 1131L that uses, for example, a gas comprising nitrogen (N2). However, the present system and method are not limited thereto. For example, in another embodiment, the third lower layer 1133L may be formed by depositing a layer including molybdenum nitride (MoN).

Figure 16:
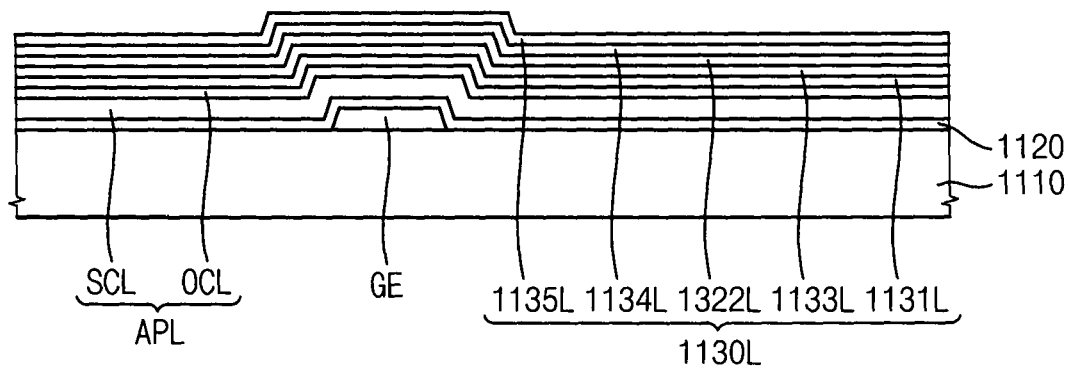

Referring to FIG. 16, a second lower layer 1132L, a low-resistance metal layer 1134L and an upper layer 1135L are formed on the base substrate 1110 on which the first lower layer 1131L and the third lower layer 1133L are formed. The second lower layer 1132L and upper layer 1135L may include the same material as the first lower layer 1131L. The second lower layer 1132L and the upper layer 1135L may include molybdenum (Mo) and/or a molybdenum alloy. The low-resistance metal layer 1134L may include aluminum (Al) and/or an aluminum alloy.

Figure 17:
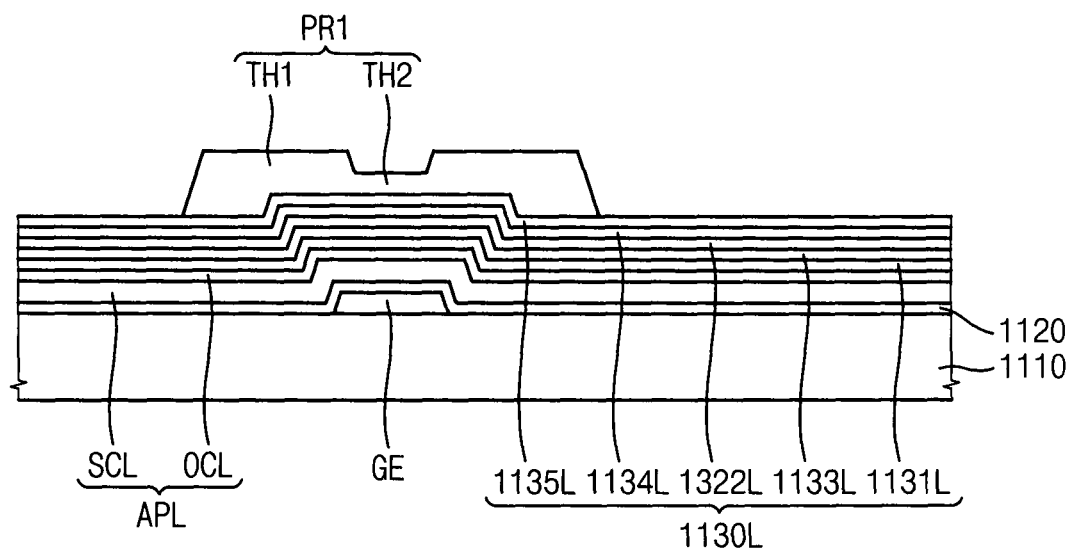

Referring to FIG. 17, a photoresist composition is coated on the source metal layer 130L to form a photoresist layer. The photoresist layer is patterned to form a first photoresist pattern PR1.

The photoresist composition may include a novolak resin, a diazide-based photo-sensitizer, and a solvent. For example, about 5% to about 30% by weight of the photoresist composition may be the novolak resin, about 2% to about 10% by weight may be the diazide-based photo-sensitizer, and the remainder may be the solvent. The novolak resin may be alkali-soluble, and may be prepared from condensation reaction of a monomer mixture including a cresol mixture, xylenol and salicylaldehyde. The cresol mixture may include m-cresol and p-cresol.

For example, about 20% to about 50% by weight of the monomer mixture may include a cresol mixture of m-cresol and p-cresol, about 20% to about 30% by weight may be xylenol, and about 30% to about 50% by weight may be salicylaldehyde. In the cresol mixture, a weight ratio of m-cresol to p-cresol may be about 3:7 to 7:3. The monomer mixture may further include formaldehyde.

The photoresist composition may be positive-typed. The photoresist layer may be pre-baked, exposed to light, developed and hard-baked to from the first photoresist pattern PR1. The temperature for pre-baking may be about 80° C. to about 120° C. The temperature for hard-baking may be about 120° C. to about 150° C.

The first photoresist pattern PR1 of FIG. 17 overlaps with the gate electrode GE and has a thickness gradient. For example, the first photoresist pattern PR1 includes a first thickness portion TH1 and a second thickness portion TH2 thinner than the first thickness portion TH1. The second thickness portion TH2 overlaps with the gate electrode GE.

The first photoresist pattern PR1 has an improved heat resistance. Thus, a profile of the first photoresist pattern PR1 may be maintained in a hard-baking process. Thus, a reliability of a photolithography process may be improved.

Figure 18:
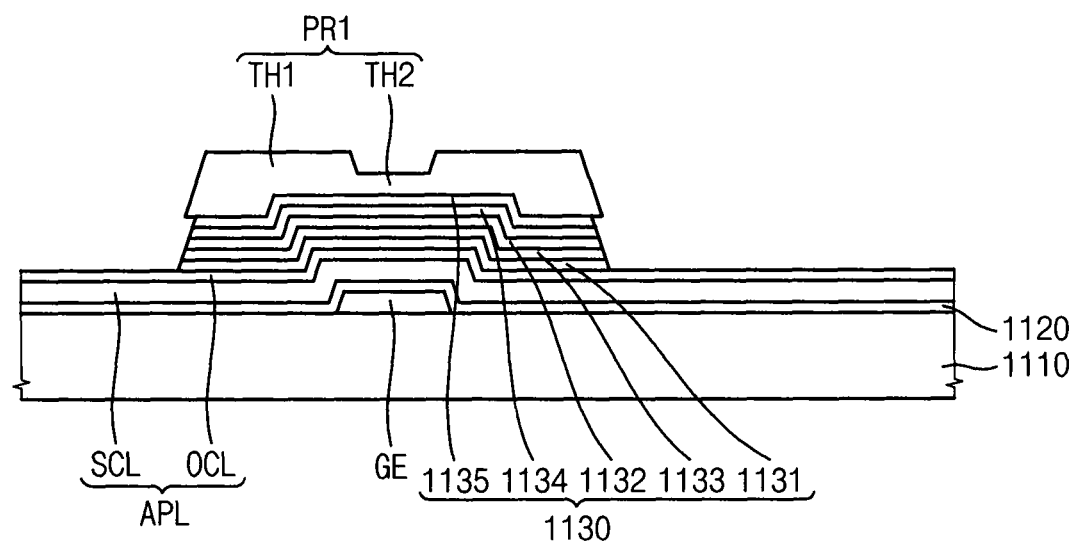

Referring to FIG. 18, the source metal layer 1130L is patterned by using the first photoresist pattern PR1 as a mask to form a source metal pattern 1130 and expose an upper surface of the ohmic contact layer OCL. In an exemplary embodiment, the source metal layer 1130L may be etched through a wet-etching process using an etchant. The source metal pattern 1130 may include a data line crossing the gate line.

Figure 19:
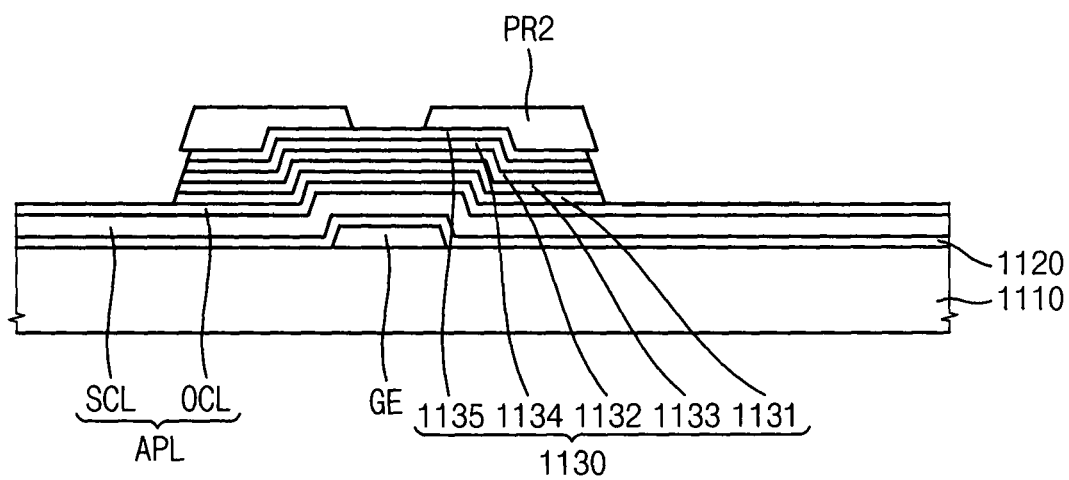

Referring to FIG. 19, the first photoresist pattern PR1 is partially removed, for example, through an ashing process. The second thickness portion TH2 is removed, and part of the first thickness portion TH1 remains to form the second photoresist pattern PR2. The second photoresist pattern PR2 exposes a portion of the source metal pattern 1130 that overlaps with the gate electrode GE.

Figure 20:
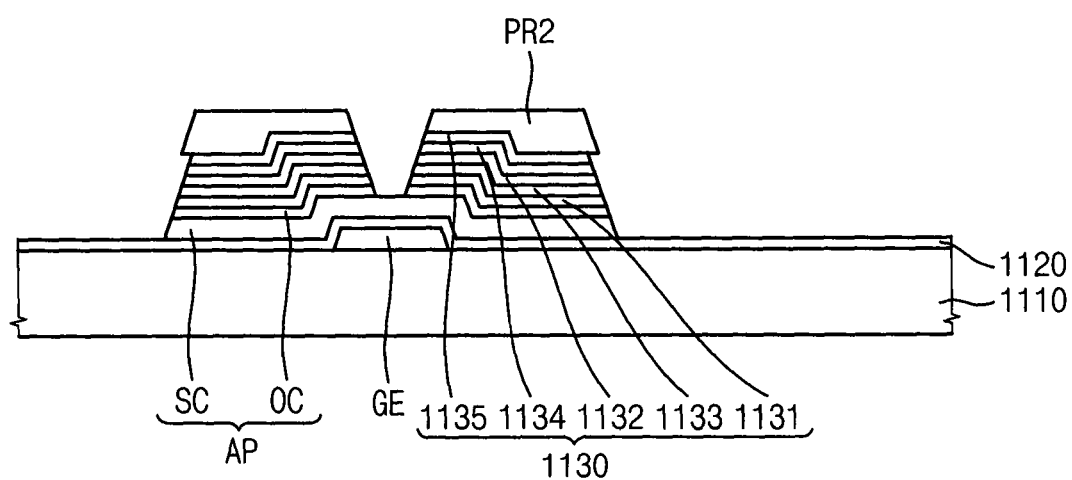

Referring to FIG. 20, the exposed portion of the source metal pattern 1130 and a portion of the ohmic contact layer OCL are removed, for example, through a dry-etching process to form a source electrode SE and a drain electrode DE. Furthermore, portions of the ohmic contact layer OCL and the semiconductor layer SCL that are not covered by the photoresist pattern are removed to form a semiconductor pattern SC and an ohmic contact pattern OC disposed on the semiconductor pattern SC.

Figure 21:
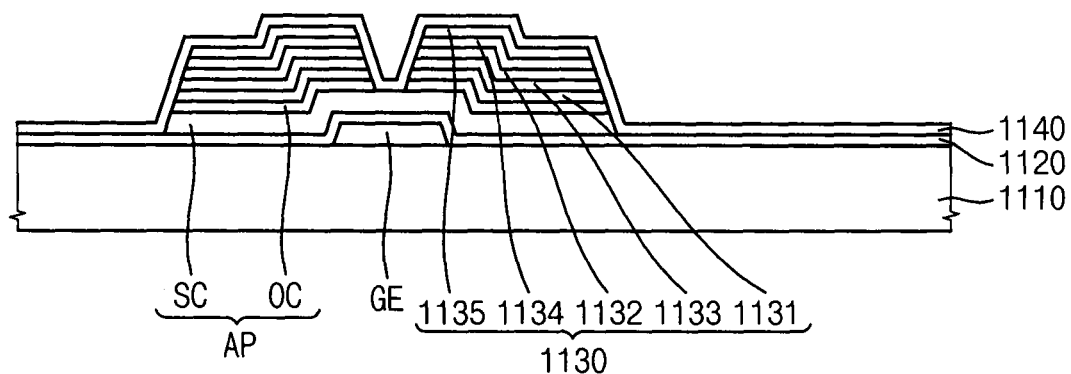

Referring to FIG. 21, a passivation layer 1140 is formed and covers the source electrode SE and the drain electrode DE. The passivation layer 1140 may include an inorganic material such as silicon oxide (SiOx) and/or silicon nitride (SiNx). The passivation layer 1140 may have a thickness of about 500 Å. In addition, the passivation layer 1140 may include a plurality of layers formed from an assortment of different materials.

Figure 22:
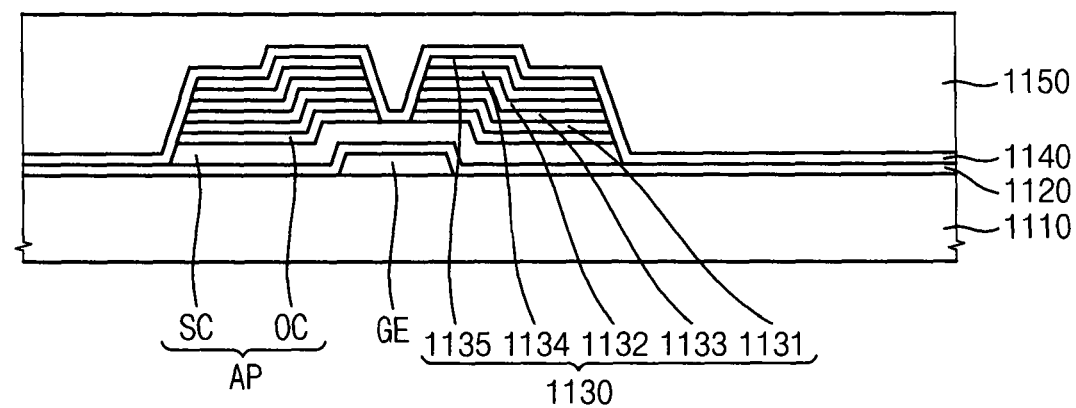

Referring to FIG. 22, an organic layer 1150 is formed on the base substrate 1110 on which the passivation layer 1140 is formed. The organic layer 1150 planarizes an upper surface of the display substrate 1100 so that the uneven steps caused by the various structures do not lead to problems such as disconnection of a signal line. The organic layer 1150 may be an insulation layer and include an organic material. The organic layer 1150 may include a color filter layer. For example, the color filter layer may have a red color, a green color, a blue color or a white color.

Figure 23:
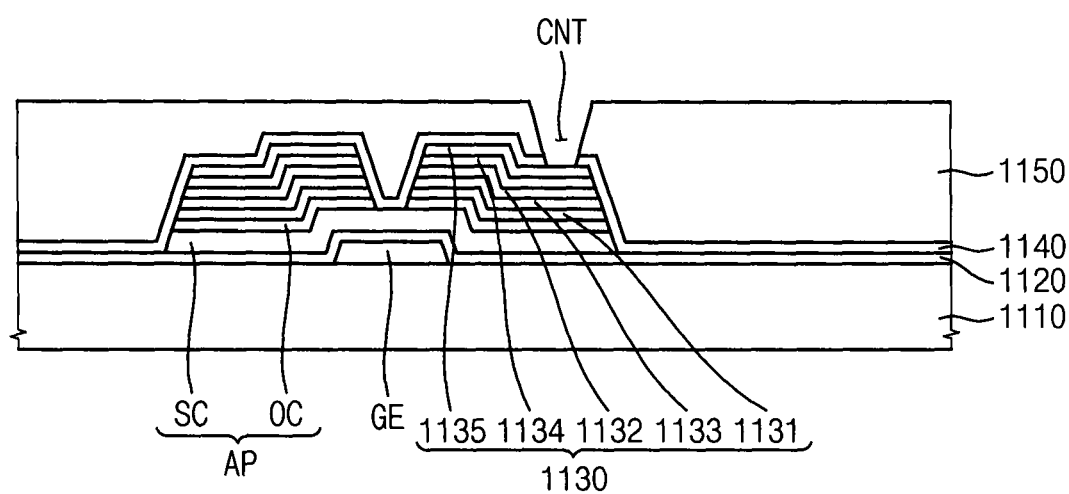

Referring to FIG. 23, a contact hole CNT is formed through the passivation layer 1140 and the organic layer 1150 to expose the drain electrode DE. As FIG. 13 shows, the pixel electrode PE is electrically connected with the drain electrode DE through the contact hole CNT. The pixel electrode PE may be formed, for example, by forming a transparent conductive layer on the organic layer 1150 and then patterning the transparent conductive layer into the pixel electrode PE. The transparent conductive layer may include a transparent conductive material, such as indium tin oxide (ITO) and indium zinc oxide (IZO).

According to an exemplary embodiment of the present system and method, the source metal pattern 1130 has a multilayer structure. The source metal pattern 1130 includes a first lower pattern 1131, a second lower pattern 1132, a third lower pattern 1133, a low-resistance metal pattern 1134, and an upper pattern 1135. The first lower pattern 1131 and the second lower pattern 1132 including molybdenum (Mo) may be deposited as a columnar shape. The first lower pattern 1131, second lower pattern 1132, and upper pattern 1135 include molybdenum (Mo) and/or a molybdenum alloy. The low-resistance metal pattern 134 includes aluminum (Al) and/or an aluminum alloy. The third lower pattern 1133 includes nitrogen (N2).

In a case in which a gas such as sulphur hexafluoride (SF6) is used in the etching process for forming the source metal pattern 1130 of the above-described embodiment, the lower pattern and the upper pattern including molybdenum (Mo) may form a molybdenum fluoride (MoFx), and the low-resistance metal pattern including aluminum (Al) may form an aluminum fluoride (ALFx). Molybdenum fluoride (MoFx) is a volatile material. However, aluminum fluoride (ALFx) is a non-volatile material. Therefore, the aluminum fluoride (ALFx) that is formed remains in a channel after the etching process is performed.

Furthermore, because the lower pattern including molybdenum (Mo) is formed as a multilayer structure (i.e., includes the first lower pattern 1131 and the second lower pattern 1132), the lower pattern in the above-described embodiment is a dense structure. The third lower pattern 1133 disposed between the first lower pattern 1131 and the second lower pattern 1132 also enhances the dense structure. The denseness of the lower pattern reduces the amount of residual aluminum in the channel and thereby prevents or otherwise reduces occurrences of a faulty display apparatus.

Figure 24:
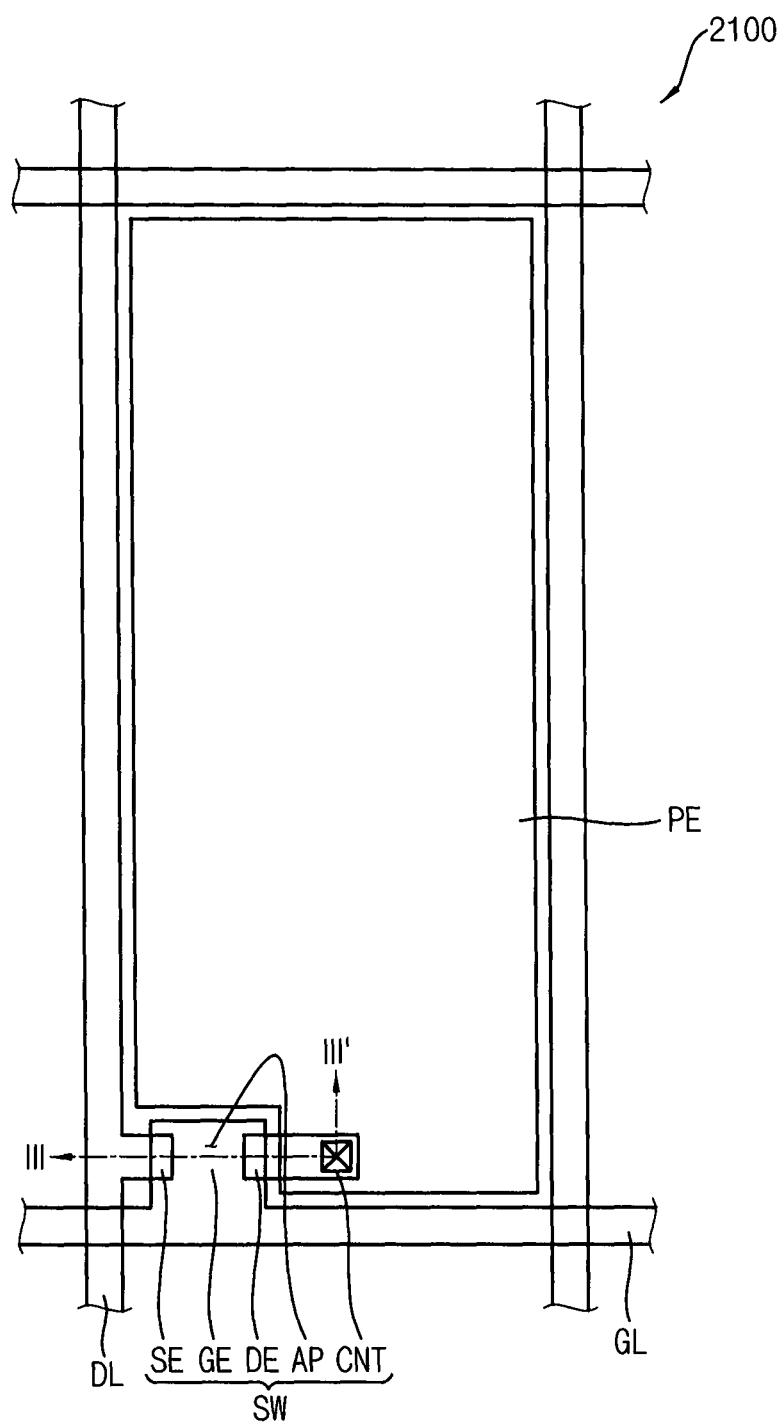
FIG. 24 is a plan view illustrating a display substrate, according to an exemplary embodiment of the present system and method.
Figure 25:
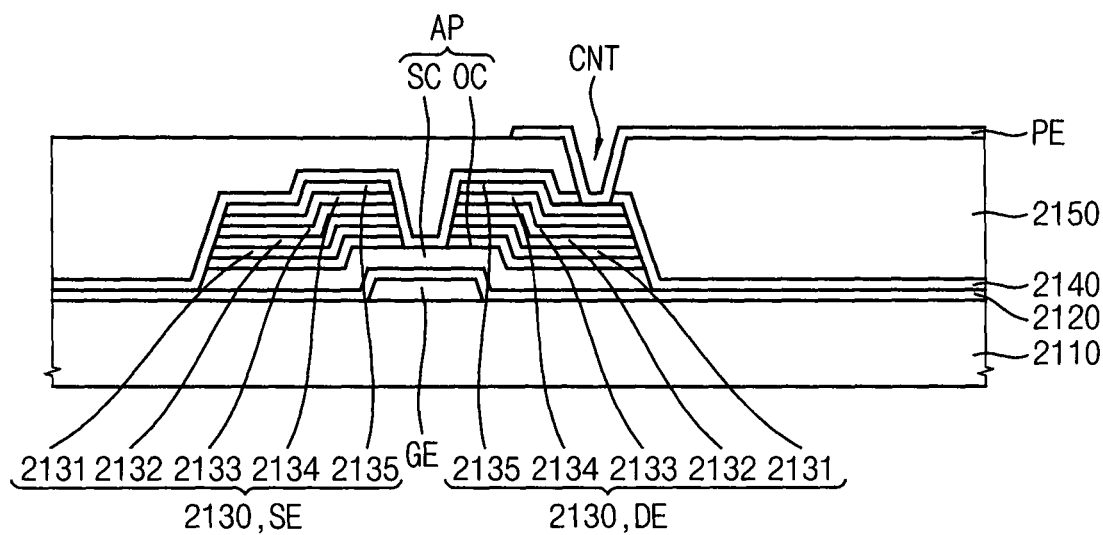
FIG. 25 is a cross-sectional view taken along a line III-III' of FIG. 24, according to an exemplary embodiment of the present system and method.

FIG. 24 is a plan view illustrating a display substrate, according to an exemplary embodiment of the present system and method. FIG. 25 is a cross-sectional view taken along a line III-III' of FIG. 24, according to an exemplary embodiment of the present system and method.

Referring to FIG. 24, a display substrate includes a gate line GL, a data line DL crossing the gate line GL, a switching element SW and a pixel electrode PE. The switching element SW may be electrically connected with the gate line GL and the data line DL. The pixel electrode PE may be electrically connected with the switching element SW through a contact hole CNT.

The gate line GL extends in a first direction D1 and is electrically connected to a gate electrode GE of the switching element SW. Portions of the gate line GL may form the gate electrode GE. In an exemplary embodiment, the gate line GL may have a single layer structure and include one or more of copper (Cu), silver (Ag), chrome (Cr), molybdenum (Mo), aluminum (Al), titanium (Ti), and manganese (Mn). In another exemplary embodiment, the gate line GL may have a multilayer structure with a plurality of layers formed from an assortment of different materials. For example, the gate line GL may include a copper layer and a titanium layer disposed on and/or under the copper layer.

Referring to FIG. 25, a gate insulation layer 2120 is formed on the gate line GL and the gate electrode GE. The gate insulation layer 2120 may include an inorganic material such as silicon oxide (SiOx) and/or silicon nitride (SiNx). The gate insulation layer 2120 may have a thickness of about 500 Å. The gate insulation layer 2120 may include a plurality of layers formed from an assortment of different materials.

An active pattern AP is formed on the gate insulation layer 2120 of FIG. 25. The active pattern AP may include a semiconductor pattern SC and an ohmic contact pattern OC. The ohmic contact pattern OC is formed on the semiconductor pattern SC. The semiconductor pattern SC may include a silicon semiconductor material. For example, the semiconductor pattern SC may include amorphous silicon (a-Si:H). The ohmic contact pattern OC may be interposed between the semiconductor pattern SC and a source electrode SE, and may be interposed between the semiconductor pattern SC and a drain electrode DE. The ohmic contact pattern OC may include n+ amorphous silicon (n+ a-Si:H).

A source metal pattern 1130 is formed on the active pattern AP of FIG. 25. The source metal pattern 2130 may include the data line DL, a source electrode SE and a drain electrode DE. The source metal pattern 2130 has a multilayer structure. The source metal pattern 2130 includes a first lower pattern 2131 disposed on the active pattern AP, a second lower pattern 2132 including the same material as the first lower pattern 2131 and disposed on the first lower pattern 1131, a third lower pattern 2133 disposed on the second lower pattern 1132, a low-resistance metal pattern 2134 disposed on the third lower pattern 2133, and an upper pattern 2135 including the same material as the first lower pattern 2131 and the second low pattern 2132 and disposed on the low-resistance metal pattern 2134.

The first lower pattern 2131, the second lower pattern 2132 and the upper pattern 2135 may include molybdenum (Mo) and/or a molybdenum alloy. The low-resistance metal pattern 2134 may include aluminum (Al) and/or an aluminum alloy. The third lower pattern 2133 may include nitrogen (N2). For example, the third lower pattern 2133 may be formed by performing a plasma process on the second lower pattern 2132 using a gas that includes nitrogen (N2). However, the present system and method are not limited thereto. In another embodiment, the third lower pattern 2133 may be formed by depositing a layer including molybdenum nitride (MoN).

A passivation layer 2140 is formed on the source metal pattern 2130 of FIG. 25. The passivation layer 2140 may include an inorganic material such as silicon oxide (SiOx) and/or silicon nitride (SiNx). The passivation layer 2140 may have a thickness of about 500 Å. The passivation layer 2140 may include a plurality of layers formed from an assortment of different materials.

An organic layer 2150 is disposed on the passivation layer 2140 of FIG. 25. The organic layer 2150 planarizes an upper surface of the display substrate 2100 so the uneven steps caused by the various underlying structures do not lead to problems such as disconnection of a signal line. The organic layer 2150 may be an insulation layer that includes an organic material. The organic layer 2150 may include a color filter layer. For example, the color filter layer may have a red color, a green color, a blue color or a white color.

A pixel electrode PE is formed on the organic layer 2150 of FIG. 25. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE, such as through the contact hole CNT.

FIGS. 26 to 35 are cross-sectional views illustrating a method of manufacturing the display substrate of FIG. 25, according to an exemplary embodiment of the present system and method.

Figure 26:
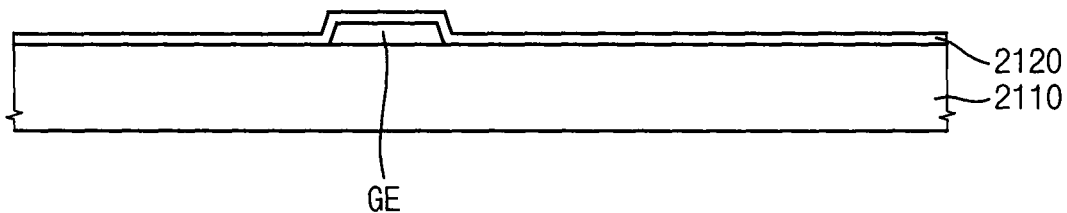
FIGS. 26 to 35 are cross-sectional views illustrating a method of manufacturing the display substrate of FIG. 25, according to an exemplary embodiment of the present system and method.

Referring to FIG. 26, a gate metal pattern including a gate electrode GE is formed on the base substrate 2110. The gate metal pattern may further include a gate line electrically connected with the gate electrode GE. The gate metal pattern may be formed by forming a gate metal layer on the base substrate 1110 and then patterning the gate metal layer to form the gate line and the gate electrode GE. Examples of the base substrate 2110 may include a glass substrate, a quartz substrate, a silicon substrate, a plastic substrate or the like.

The gate metal layer may have a single layer structure and include one or more of copper (Cu), silver (Ag), chrome (Cr), molybdenum (Mo), aluminum (Al), titanium (Ti), and manganese (Mn). In addition, the gate metal layer may have a multilayer structure with a plurality of layers formed from an assortment of different materials. For example, the gate metal layer may include a copper layer and a titanium layer disposed on and/or under the copper layer.

FIG. 26 further shows that a gate insulation layer 2120 is formed on the gate line GL and the gate electrode GE. The gate insulation layer 2120 may include an inorganic material such as silicon oxide (SiOx) and/or silicon nitride (SiNx). The gate insulation layer 2120 may include a plurality of layers formed from an assortment of different materials.

Figure 27:
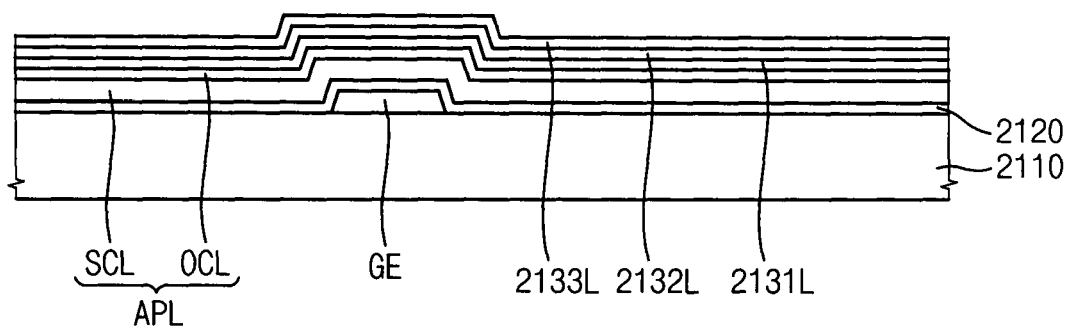

Referring to FIG. 27, a semiconductor layer SCL, an ohmic contact layer OCL and a source metal layer 2130L are formed on the gate insulation layer 2120, one on top of another in the order shown. The semiconductor layer SCL may include amorphous silicon (a-Si:H). The ohmic contact layer OCL may include n+ amorphous silicon (n+ a-Si:H). The source metal layer 2130L has a multilayer structure. The source metal layer 2130L includes a first lower layer 1131L, a second lower layer 2132L, and a third lower layer 1133L disposed on the ohmic contact layer OCL.

The first lower layer 2131L and the second lower layer 2132L may include molybdenum (Mo) and/or a molybdenum alloy. The third lower layer 2133L may include nitrogen (N2). The third lower layer 2133L may be formed by performing a plasma process on the second lower layer 2132L. The plasma process may use, for example, a gas comprising nitrogen (N2). However, the present system and method are not limited thereto. In another embodiment, the third lower layer 2133L may be formed by depositing a layer including molybdenum nitride (MoN).

Figure 28:
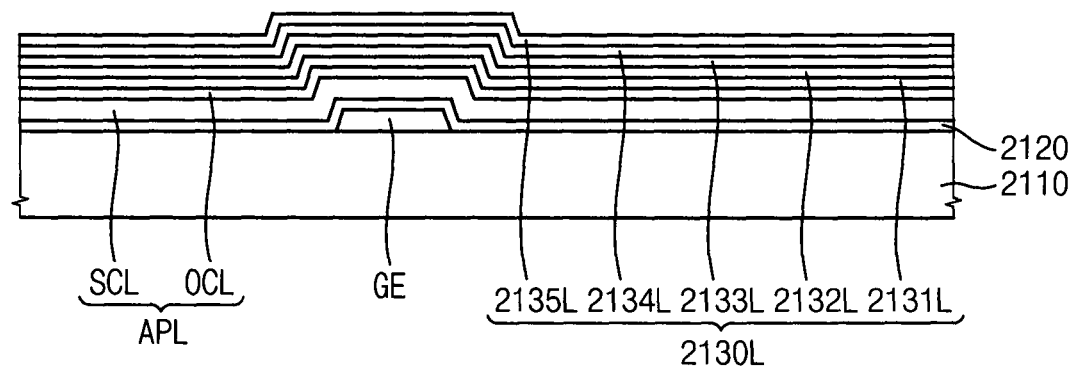

Referring to FIG. 28, a low-resistance metal layer 2134L and an upper layer 2135L are formed on the base substrate 2110 on which the first lower layer 2131L, the second lower layer 2132L and the third lower layer 2133L are formed. The upper layer 2135L may include the same material as the first lower layer 2131L and the second lower layer 2132L. The upper layer 2135L may include molybdenum (Mo) and/or a molybdenum alloy. The low-resistance metal layer 2134L may include aluminum (Al) and/or an aluminum alloy.

Figure 29:
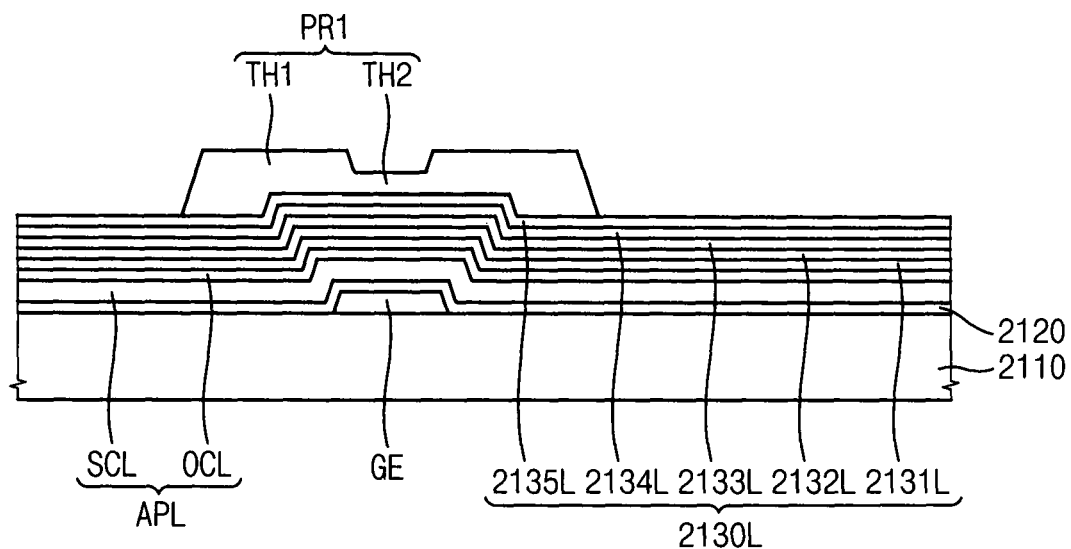

Referring to FIG. 29, a photoresist composition is coated on the source metal layer 130L to form a photoresist layer. The photoresist layer is patterned to form a first photoresist pattern PR1.

The photoresist composition may include a novolak resin, a diazide-based photo-sensitizer, and a solvent. For example, about 5% to about 30% by weight of the photoresist composition may be the novolak resin, about 2% to about 10% by weight may be the diazide-based photo-sensitizer, and the remainder may be the solvent. The novolak resin may be alkali-soluble, and may be prepared from condensation reaction of a monomer mixture including a cresol mixture, xylenol and salicylaldehyde. The cresol mixture may include m-cresol and p-cresol.

For example, about 20% to about 50% by weight of the monomer mixture may include a cresol mixture of m-cresol and p-cresol, about 20% to about 30% by weight may be xylenol, and about 30% to about 50% by weight may be salicylaldehyde. In the cresol mixture, a weight ratio of m-cresol to p-cresol may be about 3:7 to 7:3. The monomer mixture may further include formaldehyde.

The photoresist composition may be positive-typed. The photoresist layer may be pre-baked, exposed to light, developed and hard-baked to from the first photoresist pattern PR1. The temperature for pre-baking may be about 80° C. to about 120° C. The temperature for hard-baking may be about 120° C. to about 150° C.

The first photoresist pattern PR1 of FIG. 29 overlaps with the gate electrode GE, and has a thickness gradient. For example, the first photoresist pattern PR1 includes a first thickness portion TH1 and a second thickness portion TH2 thinner than the first thickness portion TH1. The second thickness portion TH2 overlaps with the gate electrode GE.

The first photoresist pattern PR1 has an improved heat resistance. Thus, a profile of the first photoresist pattern PR1 may be maintained in a hard-baking process. Thus, a reliability of a photolithography process may be improved.

Figure 30:
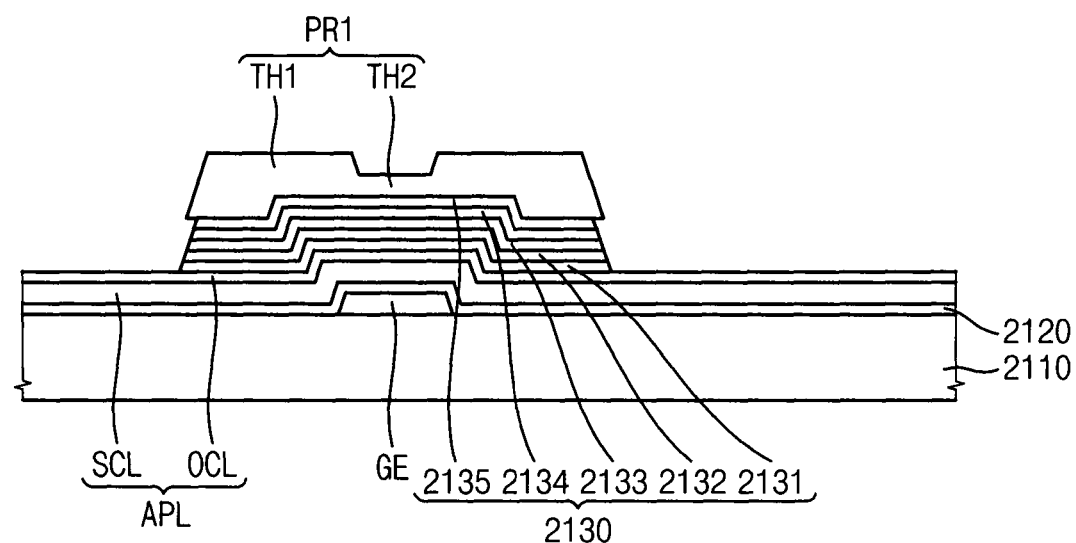

Referring to FIG. 30, the source metal layer 2130L is patterned by using the first photoresist pattern PR1 as a mask to form a source metal pattern 2130 and expose an upper surface of the ohmic contact layer OCL. In an exemplary embodiment, the source metal layer 2130L may be etched through a wet-etching process using an etchant. The source metal pattern 2130 may include a data line crossing the gate line.

Figure 31:
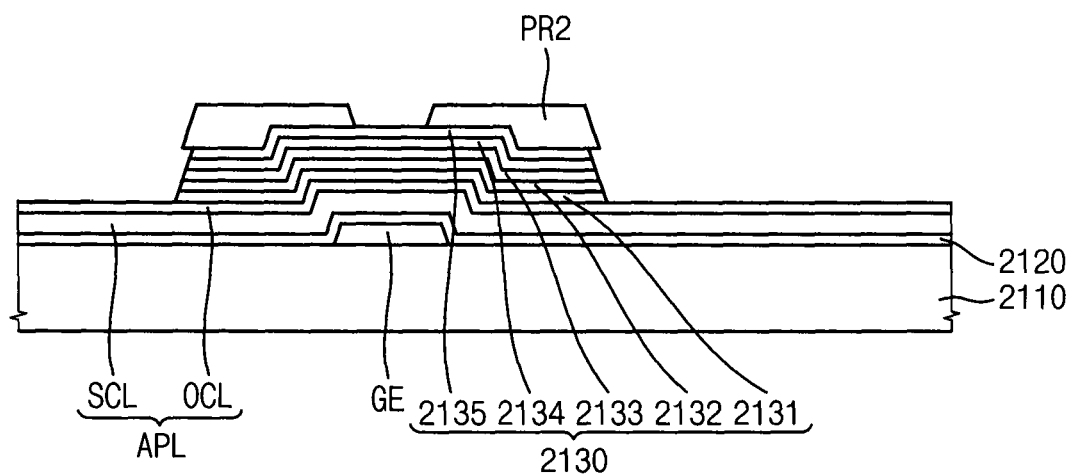

Referring to FIG. 31, the first photoresist pattern PR1 is partially removed, for example, through an ashing process. The second thickness portion TH2 is removed, and part of the first thickness portion TH1 remains to form the second photoresist pattern PR2. The second photoresist pattern PR2 exposes a portion of the source metal pattern 1130 that overlaps with the gate electrode GE.

Figure 32:
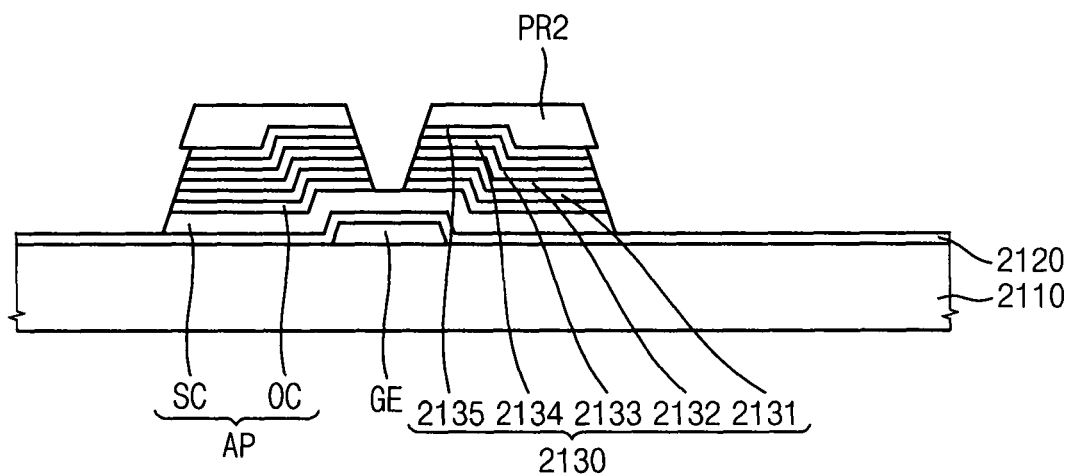

Referring to FIG. 32, the exposed portion of the source metal pattern 2130 and a portion of the ohmic contact layer OCL are removed, for example, through a dry-etching process to form a source electrode SE and a drain electrode DE. Furthermore, portions of the ohmic contact layer OCL and the semiconductor layer SCL that are not covered by the photoresist pattern are removed to form a semiconductor pattern SC and an ohmic contact pattern OC disposed on the semiconductor pattern SC.

Figure 33:
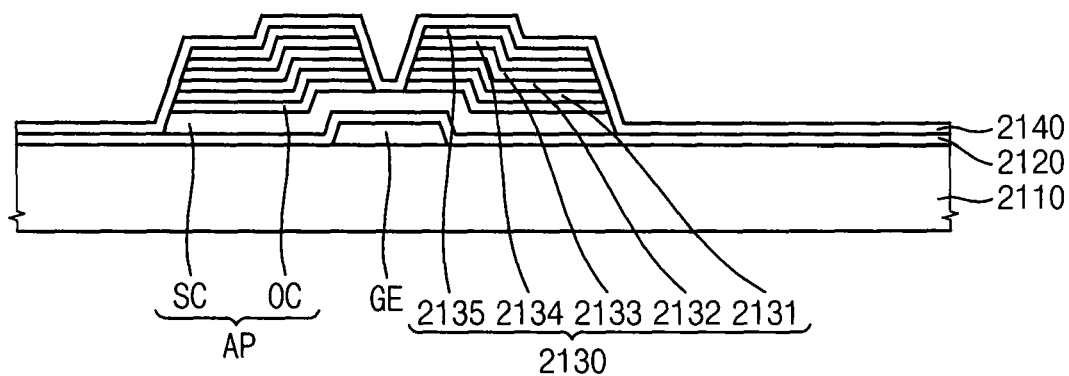

Referring to FIG. 33, a passivation layer 2140 is formed and covers the source electrode SE and the drain electrode DE. The passivation layer 2140 may include an inorganic material such as silicon oxide (SiOx) and/or silicon nitride (SiNx). The passivation layer 1140 may have a thickness of about 500 Å. In addition, the passivation layer 1140 may include a plurality of layers formed from an assortment of different materials.

Figure 34:
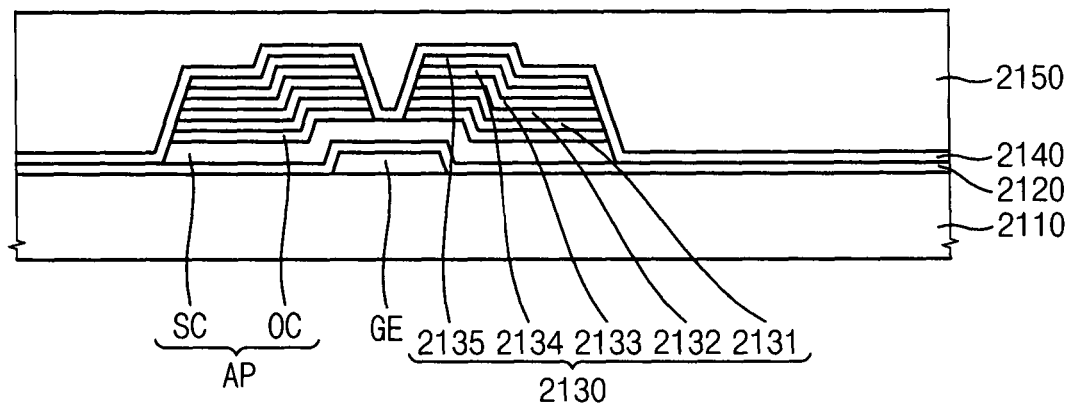

Referring to FIG. 34, an organic layer 2150 is formed on the base substrate 2110 on which the passivation layer 2140 is formed. The organic layer 2150 planarizes an upper surface of the display substrate 2100 so that the uneven steps caused by the various structures do not lead to problems such as disconnection of a signal line. The organic layer 2150 may be an insulation layer and include an organic material. The organic layer 2150 may include a color filter layer. For example, the color filter layer may have a red color, a green color, a blue color or a white color.

Figure 35:
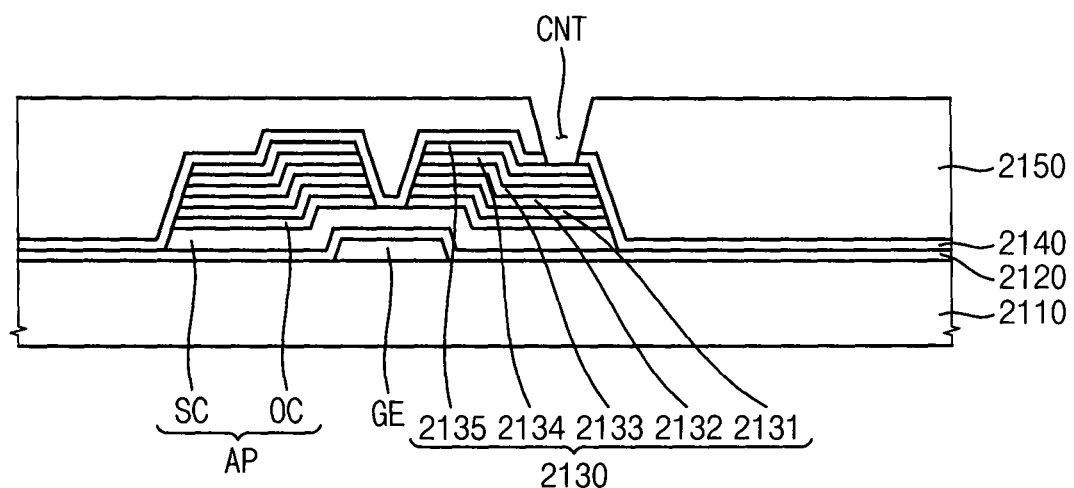

Referring to FIG. 35, a contact hole CNT is formed through the passivation layer 2140 and the organic layer 2150 to expose the drain electrode DE. As FIG. 25 shows, the pixel electrode PE is electrically connected with the drain electrode DE through the contact hole CNT. The pixel electrode PE may be formed, for example, by forming a transparent conductive layer on the organic layer 2150 and then patterning the transparent conductive layer into the pixel electrode PE. The transparent conductive layer may include a transparent conductive material, such as indium tin oxide (ITO) and indium zinc oxide (IZO).

According to an exemplary embodiment of the present system and method, the source metal pattern 2130 has a multilayer structure. The source metal pattern 2130 includes a first lower pattern 2131, a second lower pattern 2132, a third lower pattern 2133, a low-resistance metal pattern 2134, and an upper pattern 2135. The first lower pattern and the second lower pattern including molybdenum (Mo) may be deposited as a columnar shape. The first lower pattern 1131, second lower pattern 1132, and upper pattern 1135 include molybdenum (Mo) and/or a molybdenum alloy. The low-resistance metal pattern 134 includes aluminum (Al) and/or an aluminum alloy. The third lower pattern 1133 includes nitrogen (N2).

In a case in which a gas such as a sulphur hexafluoride (SF6) is used in the etching process for forming the source metal pattern 2130 of the above-described embodiment, the lower pattern and the upper pattern including molybdenum (Mo) may form a molybdenum fluoride (MoFx), and the low-resistance metal pattern including aluminum (Al) may form an aluminum fluoride (ALFx). Molybdenum fluoride (MoFx) is a volatile material. However, aluminum fluoride (ALFx) is a non-volatile material. Therefore, the aluminum fluoride (ALFx) that is formed remains in a channel after the etching process is performed.

Furthermore, because the lower pattern including molybdenum (Mo) is formed as a multilayer structure (i.e., includes the first lower pattern 1131 and the second lower pattern 1132), the lower pattern in the above-described embodiment is a dense structure. The third lower pattern 2133 disposed on the second lower pattern 2132 also enhances the dense structure. The denseness of the lower pattern reduces the amount of residual aluminum in the channel may be minimized and thereby prevents or otherwise reduces occurrences of a faulty display apparatus.

The foregoing is illustrative of the present system and method and is not limiting thereof. Although exemplary embodiments of the present system and method are described herein, those skilled in the art would understand that many modifications are possible without materially departing from the teachings and advantages of the present system and method.

What is claimed is:

1. A method of manufacturing a display substrate comprising:
    forming a gate metal pattern including a gate electrode on a base substrate;
    forming a gate insulation layer that covers the gate metal pattern;
    forming an active layer on the gate insulation layer;
    forming a source metal layer on the active layer;
    forming a photoresist layer on the source metal layer;
    developing the photoresist layer to form a first photoresist pattern; and
    forming an active pattern and a source metal pattern by etching the active layer and the source metal layer while using the first photoresist pattern as a mask,
        wherein forming the source metal layer comprises:
            depositing a first lower layer comprising molybdenum or molybdenum alloy on the active layer;
            depositing a third lower layer comprising molybdenum nitride;
            depositing a second lower layer comprising molybdenum or molybdenum alloy on the third lower layer;
            depositing a low-resistance metal layer comprising aluminum or aluminum alloy on the second lower layer; and
            depositing an upper layer comprising molybdenum or molybdenum alloy on the low-resistance metal layer, and
        wherein the source metal layer is etched by a fluorine-containing gas.

2. The method of claim 1, wherein forming the source metal layer includes performing a plasma process on the first lower layer after the first lower layer is deposited.

3. The method of claim 2, wherein performing a plasma process on the first lower layer is performed by using a gas comprising nitrogen (N2).

4. The method of claim 1, wherein forming the source metal layer further comprises performing a plasma process on the second lower layer after the second lower layer is deposited.

5. The method of claim 4, wherein performing a plasma process on the first lower layer is performed by using a gas comprising nitrogen (N2).

6. The method of claim 1, wherein forming the active pattern and the source metal pattern comprises:
    wet-etching, using the first photoresist pattern as a first mask, the source metal layer;
    removing a portion of the first photoresist pattern to form a second photoresist pattern that exposes a portion of the source metal layer; and
    dry-etching, using the second photoresist pattern as a second mask, the active and the source metal layer to form the active pattern and the source metal pattern.

7. The method of claim 1, wherein the active pattern includes silicon.

8. The method of claim 1, further comprising forming an ohmic contact pattern on the active pattern.

9. The method of claim 1, further comprising forming a pixel electrode contacting the upper layer and including a transparent conductive material.

10. The method of claim 1, wherein the source metal pattern includes a source electrode, a drain electrode spaced apart from the source electrode and a data line electrically connected to the source electrode.

* * * * *